US012590716B2

(12) United States Patent
Nelson et al.

(10) Patent No.: US 12,590,716 B2
(45) Date of Patent: Mar. 31, 2026

(54) COOLING SYSTEM WITH INTERMEDIATE CHAMBER

(71) Applicant: Johnson Controls Tyco IP Holdings LLP, Milwaukee, WI (US)

(72) Inventors: Cameron Stuart Nelson, New Freedom, PA (US); William Leslie Kopko, Jacobus, PA (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 321 days.

(21) Appl. No.: 18/020,410

(22) PCT Filed: Aug. 11, 2021

(86) PCT No.: PCT/US2021/045587
§ 371 (c)(1),
(2) Date: Feb. 8, 2023

(87) PCT Pub. No.: WO2022/035985
PCT Pub. Date: Feb. 17, 2022

(65) Prior Publication Data
US 2023/0288078 A1       Sep. 14, 2023

Related U.S. Application Data

(60) Provisional application No. 63/064,311, filed on Aug. 11, 2020.

(51) Int. Cl.
| | |
|---|---|
| *F24F 1/24* | (2011.01) |
| *F28D 15/02* | (2006.01) |
| *H05K 7/20* | (2006.01) |

(52) U.S. Cl.
CPC ............ *F24F 1/24* (2013.01); *F28D 15/0266* (2013.01); *H05K 7/20263* (2013.01); *H05K 7/20309* (2013.01)

(58) Field of Classification Search
CPC ......... F28D 15/00–15/06; H05K 7/20–7/2099; H05K 7/20245; F24F 1/24
See application file for complete search history.

(56) References Cited

U.S. PATENT DOCUMENTS

| | | |
|---|---|---|
| 9,357,675 B2 | 5/2016 | Campbell et al. |
| 2013/0105122 A1 | 5/2013 | Campbell et al. |
| (Continued) | | |

FOREIGN PATENT DOCUMENTS

| | | | | |
|---|---|---|---|---|
| CN | 110345570 A | * 10/2019 | ................ | F24F 1/42 |
| JP | 2001077257 A | * 3/2001 | ......... | F28D 15/0266 |
| (Continued) | | | | |

OTHER PUBLICATIONS

English language translation of JP3489247 to Osakabe et al. Translated Feb. 2025 (Year: 2004).*

(Continued)

*Primary Examiner* — Cassey D Bauer
(74) *Attorney, Agent, or Firm* — Fletcher Yoder, P.C.

(57) ABSTRACT

The present disclosure relates to a cooling system of a heating, ventilation, air conditioning, and refrigeration (HVAC&R) system. The cooling system includes an enclosure defining a fluid chamber, and the enclosure includes an evaporating surface configured to be in thermal communication with a liquid fluid in the fluid chamber and with an electronic component coupled to the enclosure, where the evaporating surface is configured to transfer thermal energy from the electronic component to the liquid fluid, such that the liquid fluid transitions to a vapor fluid within the fluid chamber, and includes a condensing surface configured to absorb thermal energy from the vapor fluid, such that the vapor fluid condenses into the liquid fluid within the fluid chamber. The cooling system also includes a heat rejection system coupled to an exterior surface of the enclosure, (Continued)

where the heat rejection system is configured to absorb thermal energy from the condensing surface.

17 Claims, 10 Drawing Sheets

(56)            References Cited

U.S. PATENT DOCUMENTS

| | | | |
|---|---|---|---|
| 2016/0066472 A1 | 3/2016 | Cader et al. | |
| 2017/0295671 A1 * | 10/2017 | Chiriac | G06F 1/203 |
| 2019/0269004 A1 * | 8/2019 | Mitsui | H05B 3/26 |

FOREIGN PATENT DOCUMENTS

| | | | | |
|---|---|---|---|---|
| JP | 3489247 B2 * | 1/2004 | | H01L 2924/002 |
| JP | 2016205682 A | 12/2016 | | |
| JP | 2018133529 A | 8/2018 | | |
| JP | 6606303 B1 | 11/2019 | | |
| KR | 20030034926 A | 5/2003 | | |
| WO | WO-2014102165 A1 * | 7/2014 | | F28D 15/02 |
| WO | WO-2016053227 A1 * | 4/2016 | | G05B 15/02 |
| WO | 2019018681 A1 | 1/2019 | | |

OTHER PUBLICATIONS

English language translation of JP2001077257 to Tanaka et al. Translation Feb. 2025 (Year: 2001).*
English language translation of CN110345570 to Wu et al. Translated Jun. 2025 (Year: 2019).*
PCT International Search Report and Written Opinion for PCT Application No. PCT/US2021/045587, mailed Nov. 22, 2021, 10 pgs.
European Extended Search Report for EP Application No. 21856656.0, dated Jul. 12, 2024, 9 pages.
Japanese Office Action for JP Application No. 2023-510400, dated Mar. 7, 2024, 5 pages.

* cited by examiner

COOLING SYSTEM WITH INTERMEDIATE CHAMBER

CROSS REFERENCE TO RELATED APPLICATION

This application is a U.S. National Stage Application of PCT International Application No. PCT/US2021/045587, entitled "COOLING SYSTEM WITH INTERMEDIATE CHAMBER." filed Aug. 11, 2021, which claims priority to and the benefit of U.S. Provisional Patent Application No. 63/064,311, entitled "HEAT SINK WITH INTERMEDIATE CHAMBER," filed Aug. 11, 2020, each of which is hereby incorporated by reference in its entirety for all purposes.

BACKGROUND

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

Electronics that produce heat may be cooled using any of a variety of fluids, such as air, refrigerant, water, and glycol, for example, in conjunction with a variety of heat exchangers (e.g., a coil, a shell and tube, a round-tube plate-fin, a microchannel, a heat sink, a heat pipe, and/or a finned heat exchanger). Heat exchanger design may be based on an amount heat to be removed, in addition to other factors, such as cost, heat exchanger size, and efficiency. Heat sinks are a common type of heat exchanger utilized with small electronic components because heat sinks may have a relatively compact design and low cost. Many heat sinks utilize fins for convection cooling. However, metallic materials typically used to form heat sinks may not have sufficient thermal conductivity properties to enable diffusion of heat while also enabling operation of electronic components at desired levels of efficiency.

Other heat exchanger solutions for cooling electronics include heat pipes that direct a flow of cooling fluid through a tube or pipe that enables diffusion of heat from the electronic components via conduction. Typically, the cooling fluid flows through the tube or pipe by a capillary effect, which may be generated by a wick structure on an internal surface of the heat pipe. However, heat pipe solutions may be limited due to friction and shear forces acting on the cooling fluid, which may reduce an amount of heat removed from the electronic components by the heat pipe.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a cooling system of a heating, ventilation, air conditioning, and refrigeration (HVAC&R) system includes an enclosure defining a fluid chamber, and the enclosure includes an evaporating surface configured to be in thermal communication with a liquid fluid in the fluid chamber and with an electronic component coupled to the enclosure, where the evaporating surface is configured to transfer thermal energy from the electronic component to the liquid fluid, such that the liquid fluid transitions to a vapor fluid within the fluid chamber, and includes a condensing surface configured to absorb thermal energy from the vapor fluid, such that the vapor fluid condenses into the liquid fluid within the fluid chamber. The cooling system also includes a heat rejection system coupled to an exterior surface of the enclosure, where the heat rejection system is configured to absorb thermal energy from the condensing surface.

In another embodiment, a cooling system of a heating, ventilation, air conditioning, and refrigeration (HVAC&R) system includes a heat rejection system and an enclosure defining a fluid chamber configured to contain a fluid therein. The enclosure includes a first surface configured to be in thermal communication with an electronic component coupled to the enclosure, where the first surface is configured to transfer thermal energy from the electronic component to the fluid to vaporize the fluid within the enclosure, and a second surface in thermal communication with the heat rejection system, where the second surface is configured to transfer thermal energy from the fluid to the heat rejection system to condense the fluid within the enclosure.

In a further embodiment, a heating, ventilation, air conditioning, and refrigeration (HVAC&R) system includes an electronic component configured to generate heat during operation of the HVAC&R system and a cooling system coupled to the electronic component. The cooling system includes an enclosure defining a fluid chamber configured to contain liquid fluid, an evaporating surface of the enclosure in thermal communication with the electronic component, where the evaporating surface is configured to transfer thermal energy from the electronic component to the liquid fluid in the fluid chamber to vaporize the liquid fluid into a vapor fluid, a condensing surface of the enclosure configured to be in thermal communication with a heat rejection system of the cooling system, where the condensing surface is configured to transfer thermal energy from the vapor fluid to the heat rejection system to condense the vapor fluid into the liquid fluid, and a baffle disposed within the enclosure and configured to direct the vapor fluid from the evaporating surface toward the condensing surface.

BRIEF DESCRIPTION OF THE DRAWINGS

Various aspects of this disclosure may be better understood upon reading the following detailed description and upon reference to the drawings in which.

3

Figure 6:
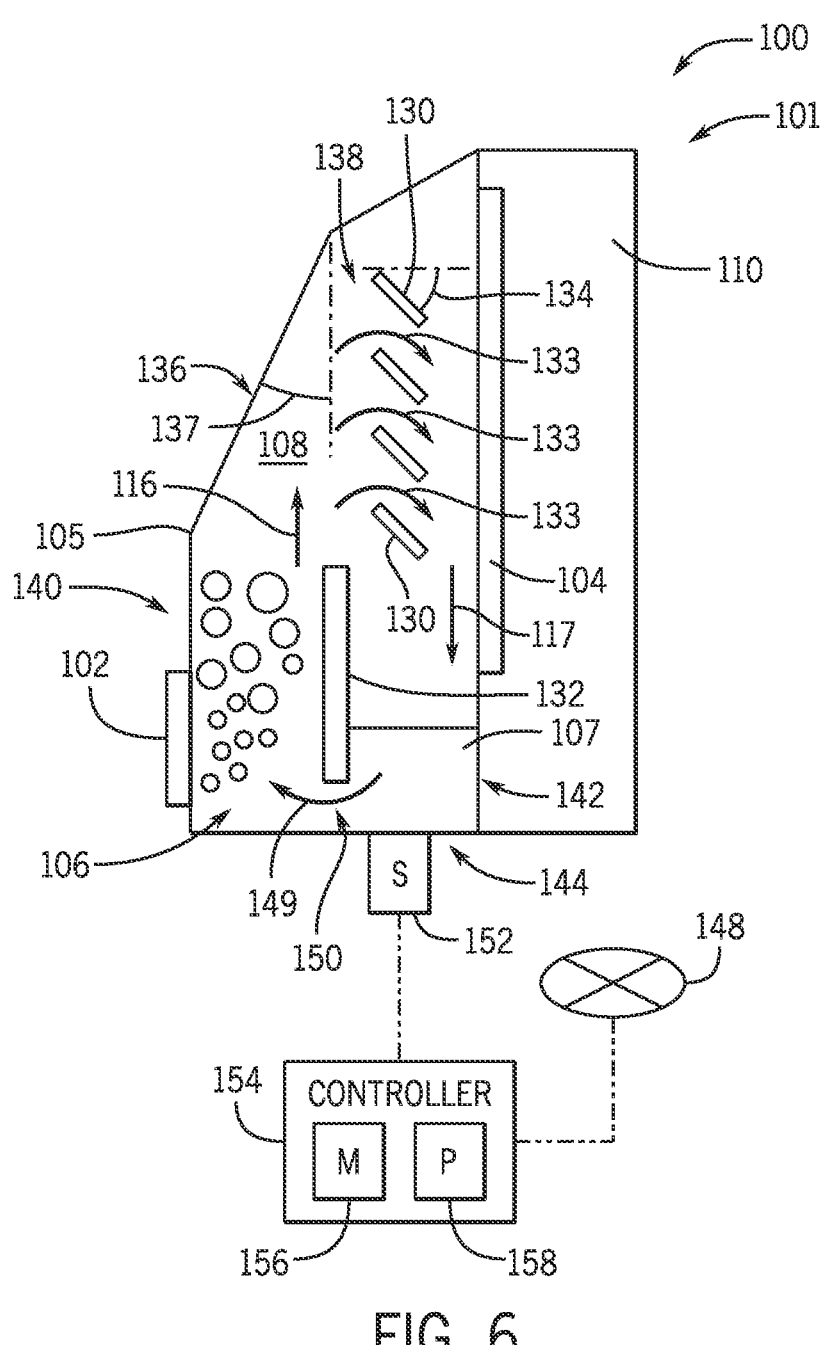
Figure 7:
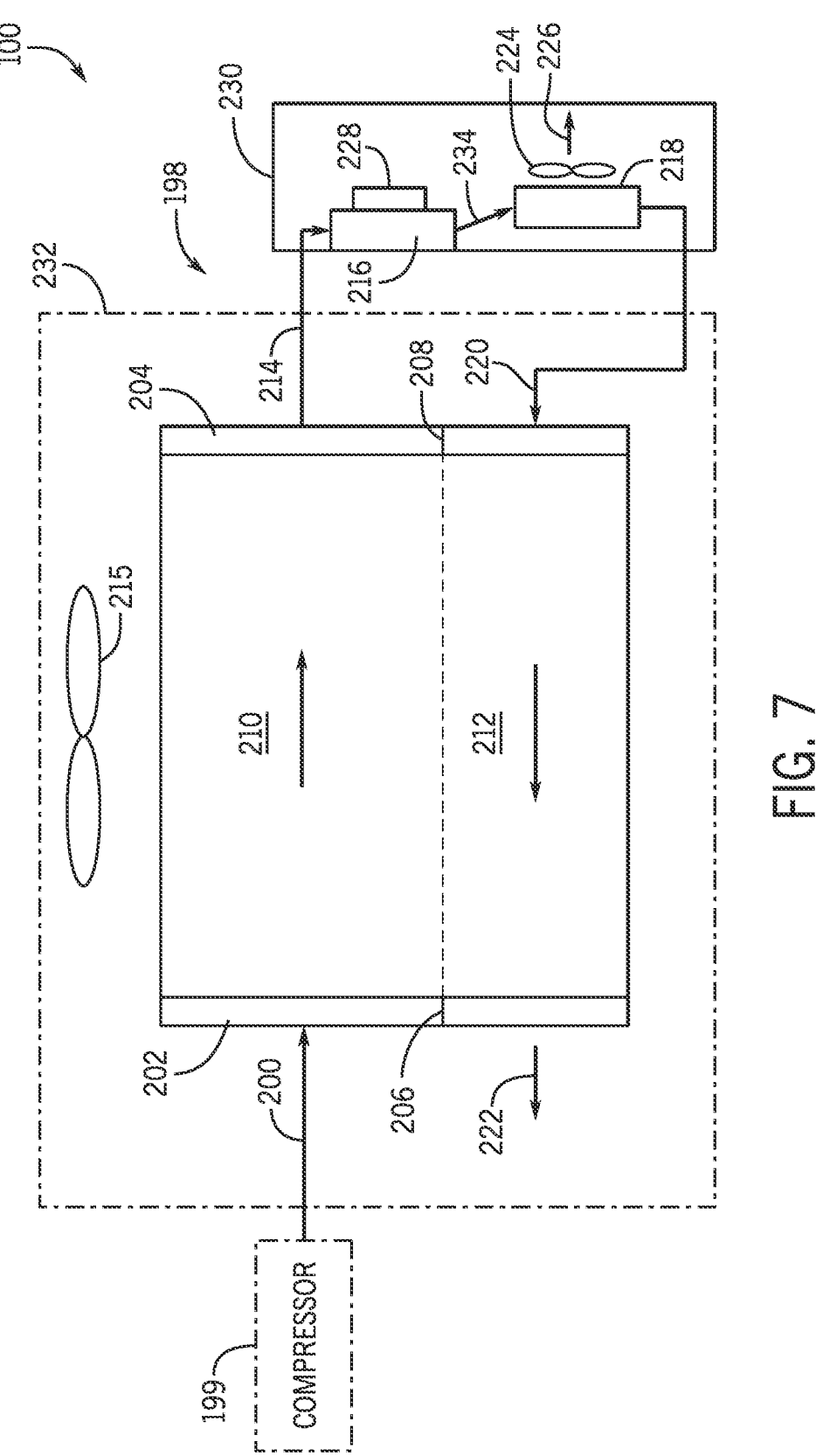
Figure 8:
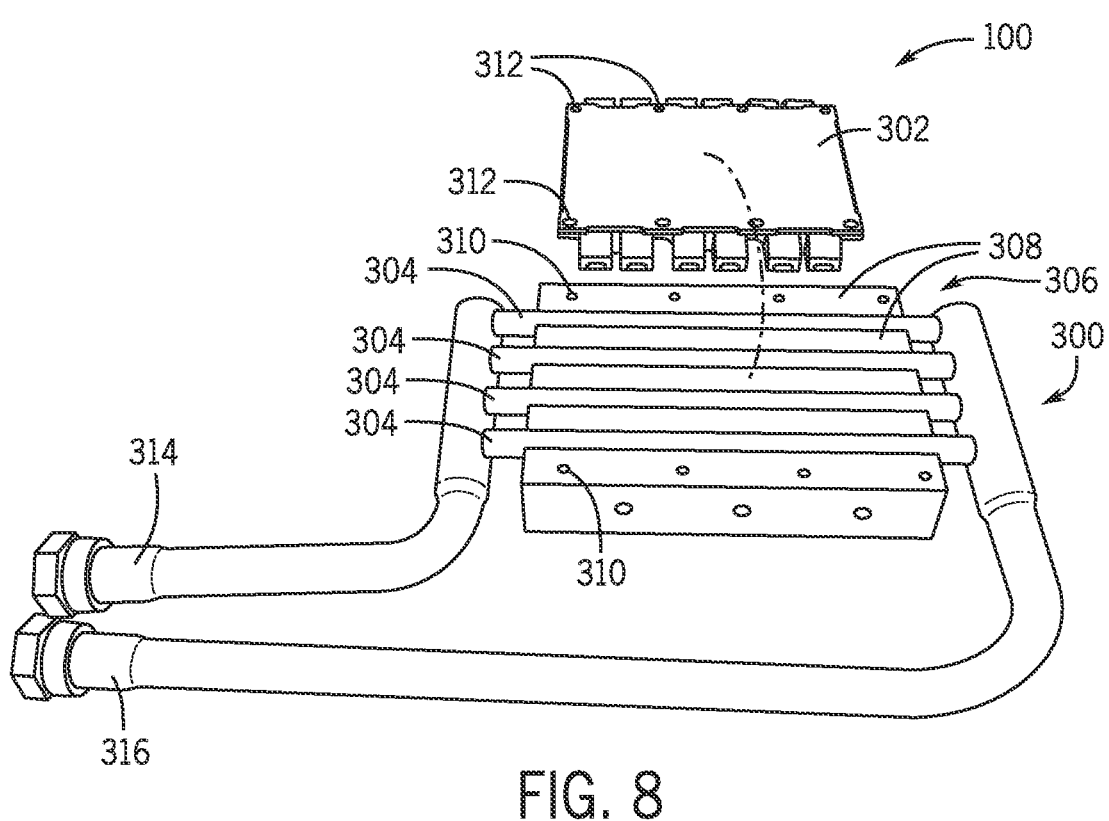
Figure 9:
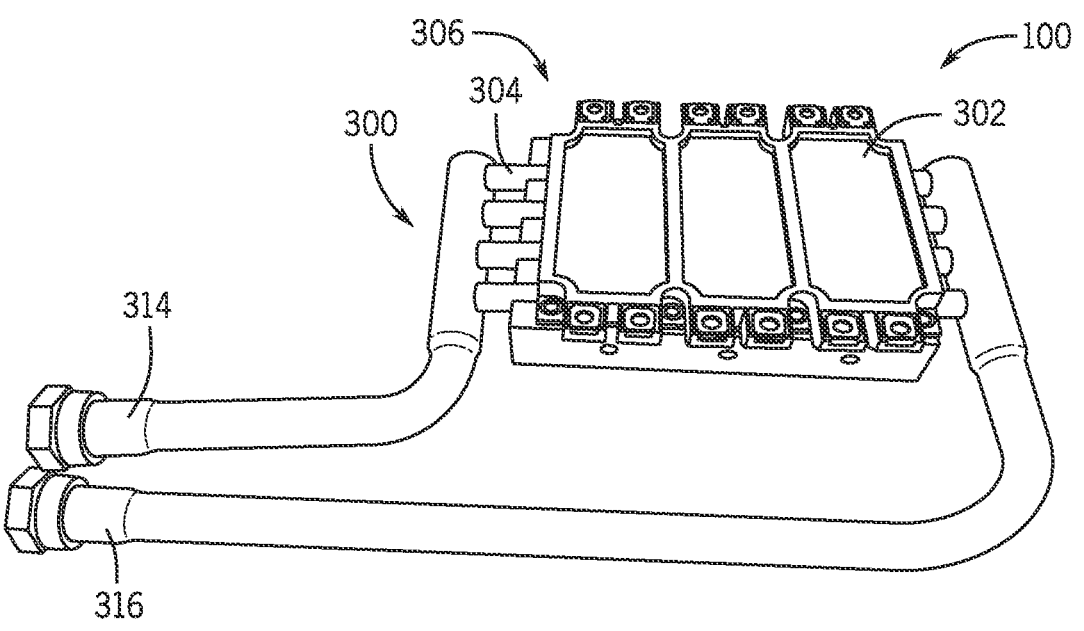
Figure 10:
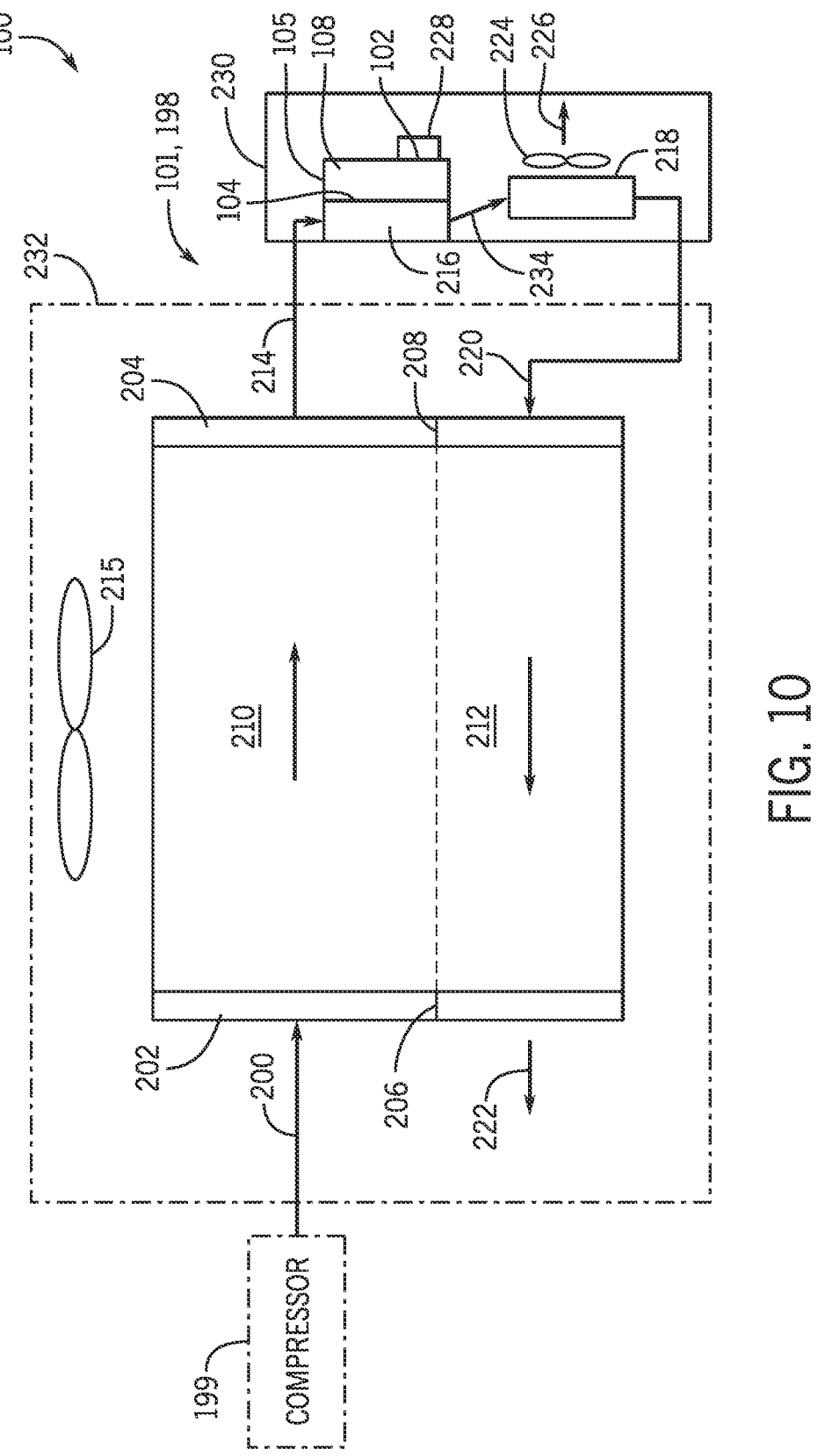
Figure 11:
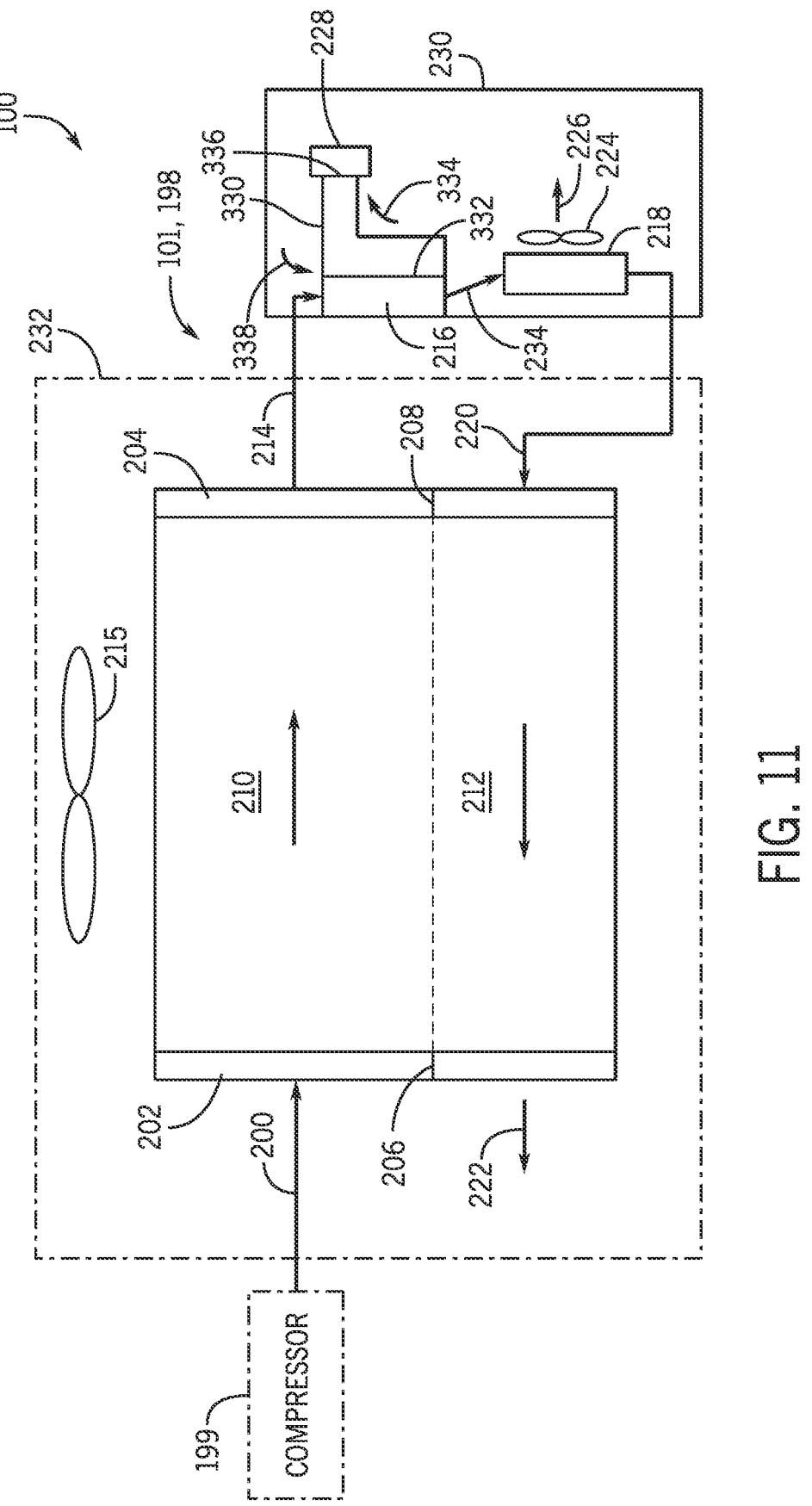

FIG. 6 is a schematic cross-sectional side view of an embodiment of a cooling system with an intermediate fluid chamber, in accordance with an aspect of the present disclosure;

FIG. 7 is a schematic of an embodiment of a cooling system including a refrigerant circuit configured to cool an electronic component, in accordance with aspects of the present disclosure;

FIG. 8 is a perspective view of an embodiment of a heat exchanger configured to cool an electronic component, in accordance with an aspect of the present disclosure;

FIG. 9 is a perspective view of an embodiment of a heat exchanger coupled to and configured to cool an electronic component, in accordance with an aspect of the present disclosure;

FIG. 10 is a schematic view of an embodiment of a cooling system including a refrigerant circuit configured to cool an intermediate fluid chamber coupled to an electronic component, in accordance with an aspect of the present disclosure; and FIG. 11 is a schematic view of an embodiment of a cooling system including a refrigerant circuit configured to cool a heat pipe coupled to an electronic component, in accordance with an aspect of the present disclosure.

DETAILED DESCRIPTION

One or more specific embodiments of the present disclosure will be described below. These described embodiments are examples of the presently disclosed techniques. Additionally, in an effort to provide a concise description of these embodiments, certain features of an actual implementation may not be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

A heating, ventilation, air conditioning, and refrigeration (HVAC&R) system may be used to thermally regulate a space within a building, home, or other suitable structure. For example, the HVAC&R system may include a vapor compression system that transfers thermal energy between a heat transfer fluid, such as a refrigerant, and a fluid to be conditioned, such as air or water. The vapor compression system may include a condenser and an evaporator that are fluidly coupled to one another via a conduit. A compressor may be used to circulate the fluid through the conduit and, thus, enable the transfer of thermal energy between the condenser and the evaporator.

In many cases, the compressor of the HVAC&R system may be driven by a motor. The motor may be communicatively coupled to a control system, which may include a variable speed drive (VSD). Each VSD may include multiple electronic components, such as a printed circuit board, that may produce a relatively high heat flux (e.g., 1 megawatt per square meter ($MW/m^2$)). In order to efficiently operate these electronic components, a cooling system may be utilized to remove heat from and generated by the electronic components to avoid overheating of the electronic components. Typical cooling systems include liquid-cooled and air-cooled configurations that reject heat from the electronic components via a flow of liquid and air, respectively. For example, a liquid-cooled cooling system may include a heat pipe that circulates fluid through a tube that is in thermal communication with the electronic components. An air-cooled cooling system may include a fan that forces an air flow across the surface of the electronic components and/or a heat sink attached to the electronic components. Accordingly, different cooling systems may be used to cool individual electronic components within the VSD. Unfortunately, conventional cooling systems have drawbacks related to size, cooling capacity, and/or cost.

Embodiments of the present disclosure are directed to an improved cooling system that includes a fluid chamber and a heat rejection system (e.g., a heat sink), such as fins. For example, the improved cooling system may include a fluid chamber coupled to an electronic component, which places the electronic component in thermal communication with a fluid (e.g., refrigerant of an HVAC&R system, dedicated or isolated refrigerant, water, etc.) disposed within the fluid chamber. Additionally, the heat rejection system may be in thermal communication with the fluid to cool the fluid. In certain embodiments, the heat rejection system (e.g., heat sink) may include fins coupled to a portion of the fluid chamber to place the fluid in thermal communication with air or other fluid flow external to the fluid chamber (e.g., surrounding the fins). In some embodiments, the air may be forced to flow across the fins (e.g., via a fan) to facilitate cooling of the fluid and therefore increase an amount of cooling provided by the fluid of the cooling system. The fluid chamber may include an evaporating surface (e.g., in thermal communication with the electronic component) and a condensing surface (e.g., in thermal communication with the fins). As such, the fluid within the fluid chamber may absorb heat (e.g., thermal energy) from the electronic component at the evaporating surface. As the fluid absorbs heat, the fluid may evaporate and flow within the fluid chamber towards the condensing surface. In particular, liquid fluid may absorb heat from the electronic component via the evaporating surface, evaporate into a vapor fluid, and rise within the fluid chamber to flow towards the condensing surface. Vapor fluid may contact the condensing surface to transfer heat from the vapor fluid to the fins and thereby condense back into liquid fluid. Additionally, the fins may transfer heat to the external air (e.g., air surrounding the fluid chamber), thereby rejecting the heat from the cooling system. The fins may transfer heat to the external air via natural or forced convection. As such, the improved cooling system may utilize both conduction and convection to improve cooling of electronic components as compared to traditional cooling systems.

In additional or alternative embodiments, the cooling system may include a different heat rejection system configured to cool the fluid within the fluid chamber. By way of example, the cooling system may include a refrigerant system (e.g., a vapor compression system, a refrigerant circuit, an air-cooled chiller), which may circulate an additional fluid (e.g., refrigerant, water). The refrigerant system may cool the additional fluid and place the additional fluid in thermal communication with the fluid in the fluid chamber, such as at the condensing surface. In this way, the cooling system may provide additional or alternative cooling than that provided by fins or other heat sink for the fluid in the fluid chamber.

Figure 1:
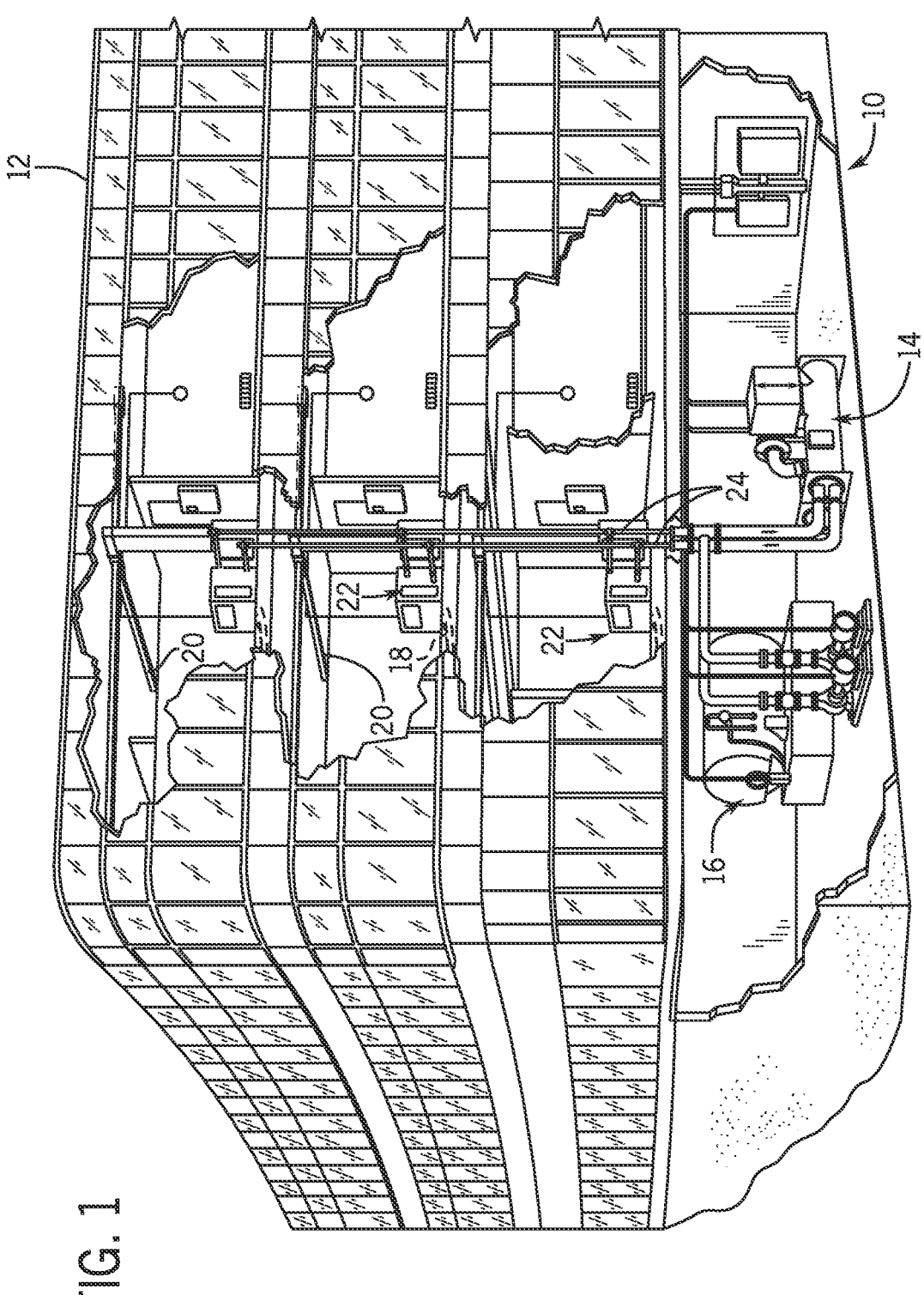
FIG. 1 is a perspective view of an embodiment of a building that may utilize a heating, ventilation, air conditioning, and refrigeration (HVAC&R) system in a commercial setting, in accordance with an aspect of the present disclosure.

Turning now to the drawings, FIG. 1 is a perspective view of an embodiment of an environment for a heating, ventilation, air conditioning, and refrigeration (HVAC&R) system 10 in a building 12 for a typical commercial setting. The HVAC&R system 10 may include a vapor compression system 14 (e.g., a chiller, a heat pump, an air handling unit, an air conditioner, a refrigerator, a freezer) that supplies a chilled liquid, which may be used to cool the building 12. The HVAC&R system 10 may also include a boiler 16 to supply warm liquid to heat the building 12 and an air distribution system which circulates air through the building 12. The air distribution system may also include an air return duct 18, an air supply duct 20, and/or an air handler 22. In some embodiments, the air handler 22 may include a heat exchanger that is connected to the boiler 16 and the vapor compression system 14 by conduits 24. The heat exchanger in the air handler 22 may receive either heated liquid from the boiler 16 or chilled liquid from the vapor compression system 14, depending on the mode of operation of the HVAC&R system 10. The HVAC&R system 10 is shown with a separate air handler on each floor of building 12, but in other embodiments, the HVAC&R system 10 may include air handlers 22 and/or other components that may be shared between or among floors.

Figure 2:
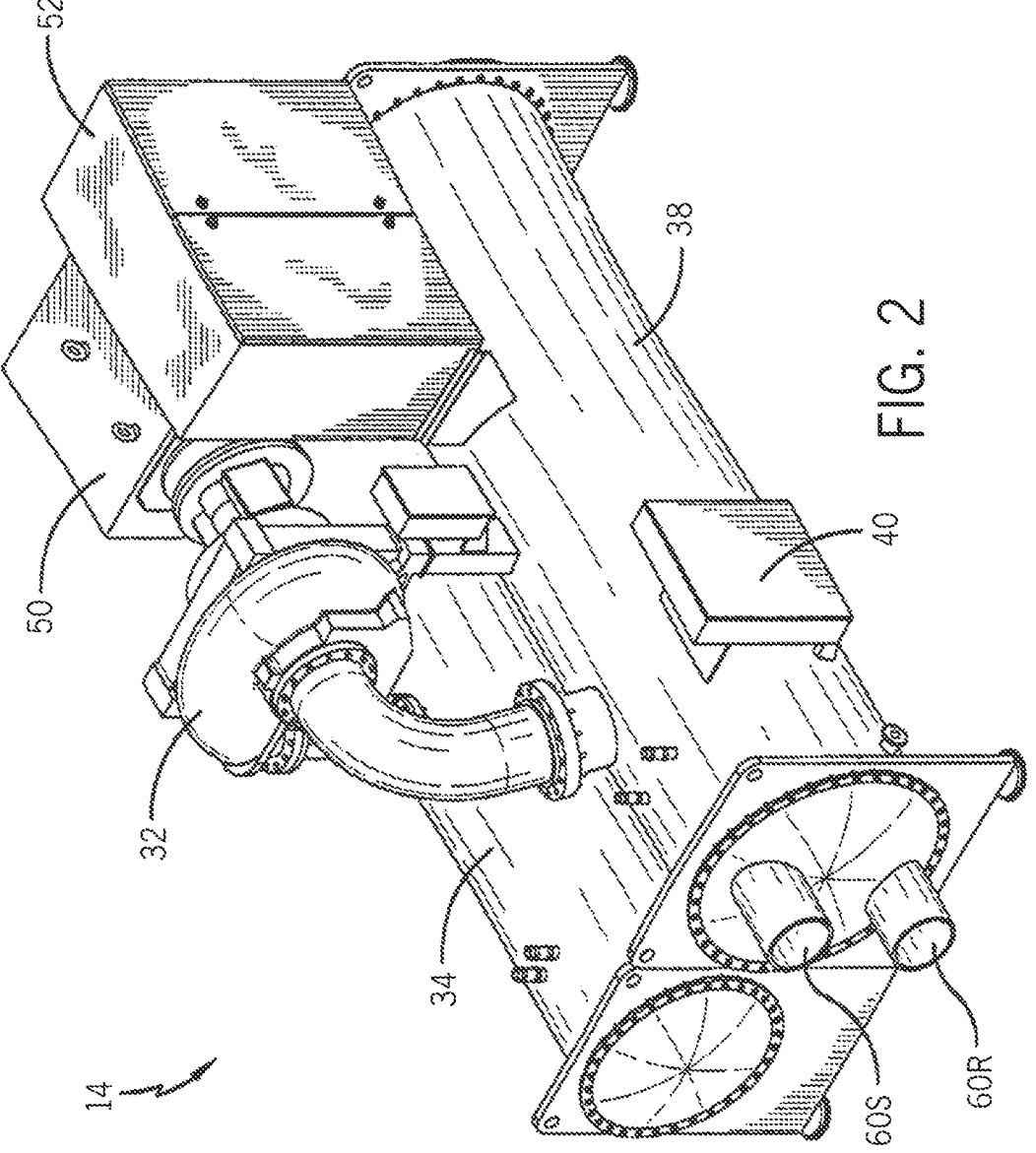
FIG. 2 is a perspective view of an embodiment of a vapor compression system, in accordance with an aspect of the present disclosure.
Figure 3:
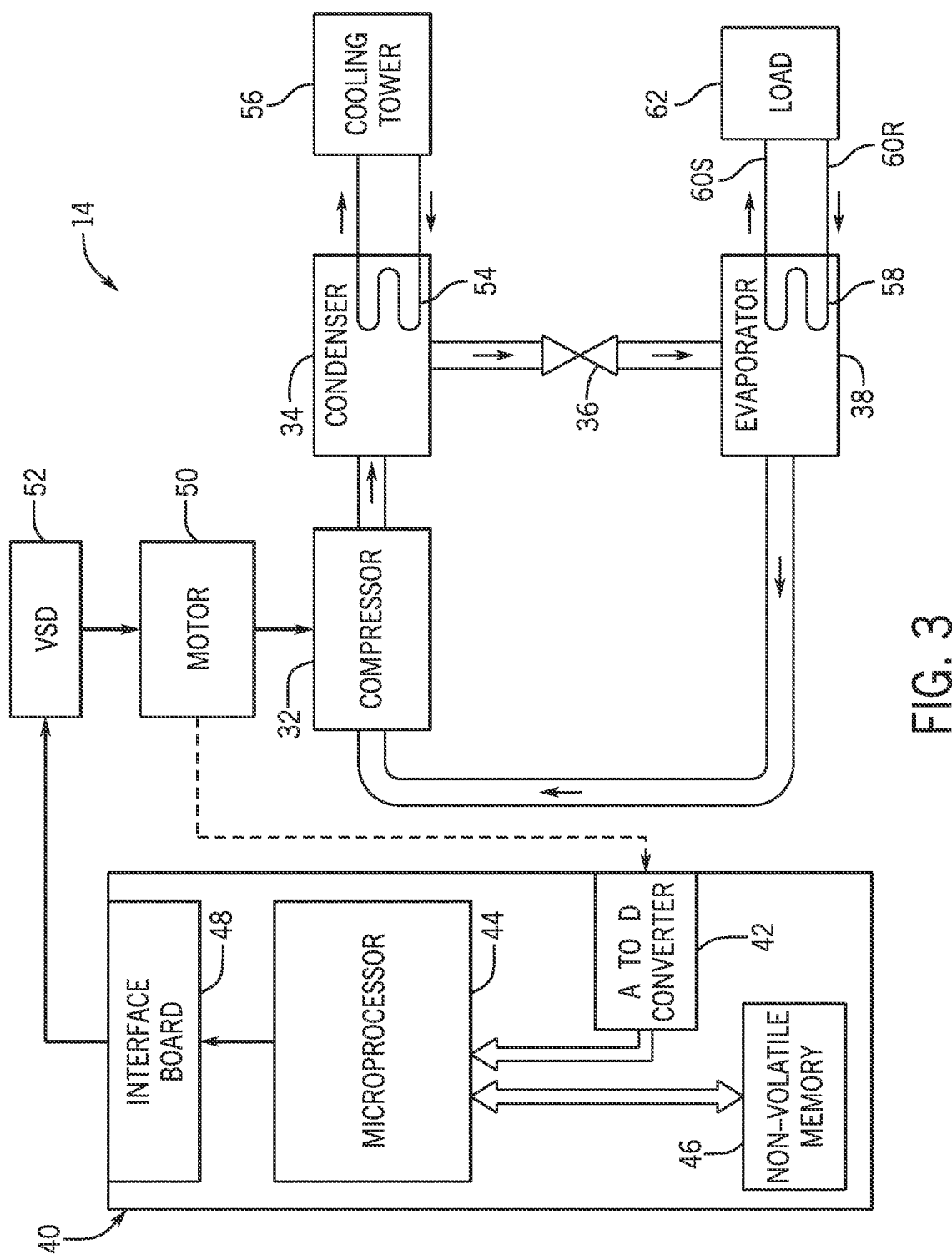
FIG. 3 is a schematic of an embodiment of a vapor compression system, in accordance with an aspect of the present disclosure.

FIGS. 2 and 3 illustrate embodiments of the vapor compression system 14 that may be used in the HVAC&R system 10. The vapor compression system 14 may circulate a refrigerant through a circuit starting with a compressor 32. The circuit may also include a condenser 34, an expansion valve(s) or device(s) 36, and a liquid chiller or an evaporator 38. The vapor compression system 14 may further include a control panel 40 that has an analog to digital (A/D) converter 42, a microprocessor 44, a non-volatile memory 46, and/or an interface board 48.

Some examples of fluids that may be used as refrigerants in the vapor compression system 14 are hydrofluorocarbon (HFC) based refrigerants, for example, R-410A, R-407, R-134a, hydrofluoro olefin (HFO), "natural" refrigerants like ammonia ($NH_3$), R-717, carbon dioxide ($CO_2$), R-744, or hydrocarbon based refrigerants, water vapor, or any other suitable refrigerant. In some embodiments, the vapor compression system 14 may be configured to efficiently utilize refrigerants having a normal boiling point of about 19 degrees Celsius (66 degrees Fahrenheit) at one atmosphere of pressure, also referred to as low pressure refrigerants, versus a medium pressure refrigerant, such as R-134a. As used herein, "normal boiling point" may refer to a boiling point temperature measured at one atmosphere of pressure.

In some embodiments, the vapor compression system 14 may use one or more of a variable speed drive (VSDs) 52, a motor 50, the compressor 32, the condenser 34, the expansion valve or device 36, and/or the evaporator 38. The motor 50 may drive the compressor 32 and may be powered by a variable speed drive (VSD) 52. The VSD 52 receives alternating current (AC) power having a particular fixed line voltage and fixed line frequency from an AC power source, and provides power having a variable voltage and frequency to the motor 50. In other embodiments, the motor 50 may be powered directly from an AC or direct current (DC) power source. The motor 50 may include any type of motor that may be powered by a VSD or directly from an AC or DC power source, such as a switched reluctance motor, an induction motor, an electronically commutated permanent magnet motor, or another suitable motor.

The compressor 32 compresses a refrigerant vapor and delivers the vapor to the condenser 34 through a discharge passage. In some embodiments, the compressor 32 may be a centrifugal compressor. The refrigerant vapor delivered by the compressor 32 to the condenser 34 may transfer heat to a cooling fluid (e.g., water or air) in the condenser 34. The refrigerant vapor may condense to a refrigerant liquid in the condenser 34 as a result of thermal heat transfer with the cooling fluid. The liquid refrigerant from the condenser 34 may flow through the expansion device 36 to the evaporator 38. In the illustrated embodiment of FIG. 3, the condenser 34 is water cooled and includes a tube bundle 54 connected to a cooling tower 56, which supplies the cooling fluid to the condenser 34.

The liquid refrigerant delivered to the evaporator 38 may absorb heat from another cooling fluid, which may or may not be the same cooling fluid used in the condenser 34. The liquid refrigerant in the evaporator 38 may undergo a phase change from the liquid refrigerant to a refrigerant vapor. As shown in the illustrated embodiment of FIG. 3, the evaporator 38 may include a tube bundle 58 having a supply line 60S and a return line 60R connected to a cooling load 62. The cooling fluid of the evaporator 38 (e.g., water, ethylene glycol, calcium chloride brine, sodium chloride brine, or any other suitable fluid) enters the evaporator 38 via return line 60R and exits the evaporator 38 via supply line 60S. The evaporator 38 may reduce the temperature of the cooling fluid in the tube bundle 58 via thermal heat transfer with the refrigerant. The tube bundle 58 in the evaporator 38 may include a plurality of tubes and/or a plurality of tube bundles. In any case, the vapor refrigerant exits the evaporator 38 and returns to the compressor 32 by a suction line to complete the cycle.

Figure 4:
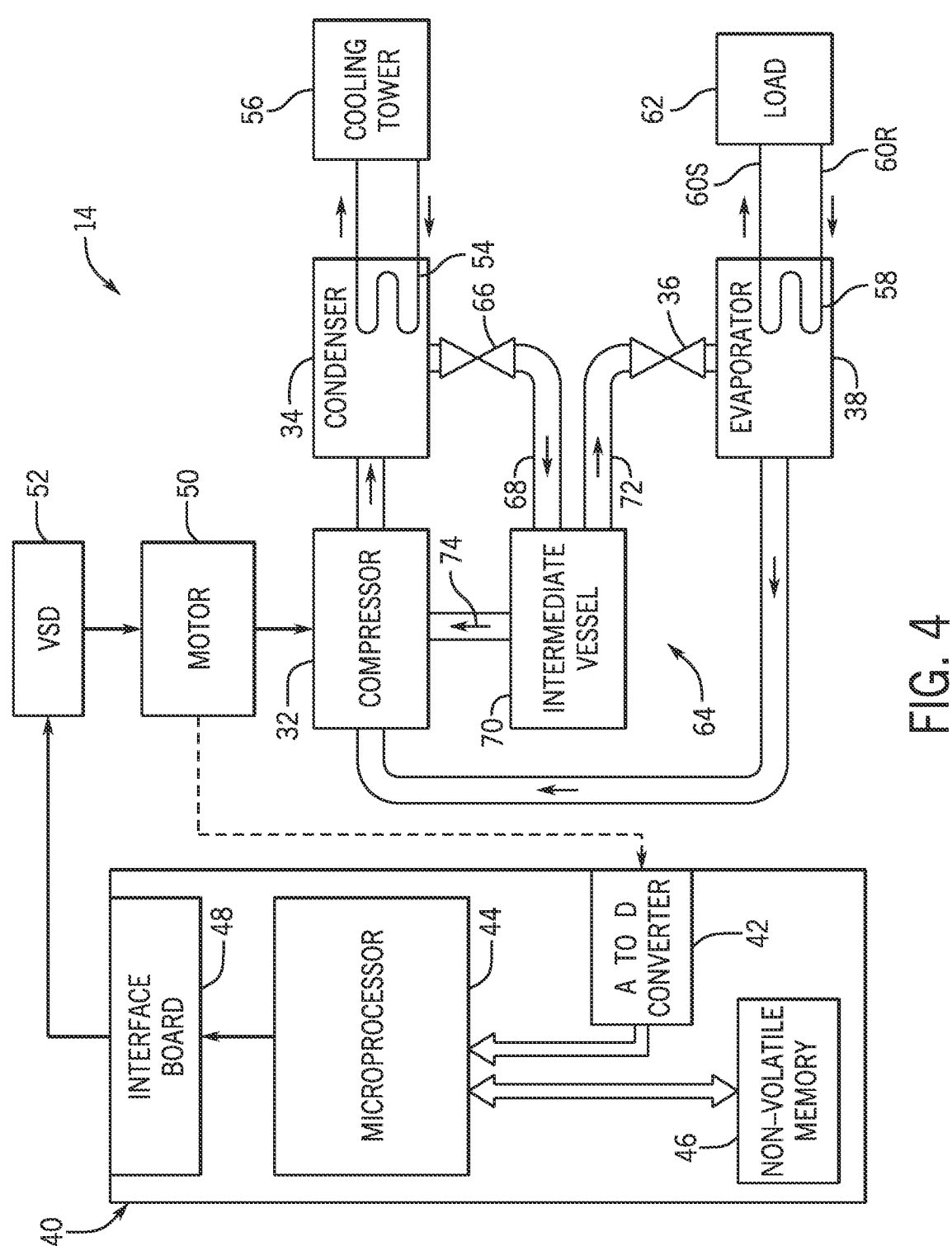
FIG. 4 is a schematic of an embodiment of a vapor compression system, in accordance with an aspect of the present disclosure.

FIG. 4 is a schematic of an embodiment of the vapor compression system 14 with an intermediate circuit 64 incorporated between condenser 34 and the expansion device 36. The intermediate circuit 64 may have an inlet line 68 that is directly fluidly connected to the condenser 34. In other embodiments, the inlet line 68 may be indirectly fluidly coupled to the condenser 34. As shown in the illustrated embodiment of FIG. 4, the inlet line 68 includes a first expansion device 66 positioned upstream of an intermediate vessel 70. In some embodiments, the intermediate vessel 70 may be a flash tank (e.g., a flash intercooler). In other embodiments, the intermediate vessel 70 may be configured as a heat exchanger or a "surface economizer." In the illustrated embodiment of FIG. 4, the intermediate vessel 70 is used as a flash tank, and the first expansion device 66 is configured to lower the pressure of (e.g., expand) the liquid refrigerant received from the condenser 34. During the expansion process, a portion of the liquid may vaporize, and thus, the intermediate vessel 70 may be used to separate the vapor from the liquid received from the first expansion device 66.

Additionally, the intermediate vessel 70 may provide for further expansion of the liquid refrigerant because of a pressure drop experienced by the liquid refrigerant when entering the intermediate vessel 70 (e.g., due to a rapid increase in volume experienced when entering the intermediate vessel 70). The vapor in the intermediate vessel 70 may be drawn by the compressor 32 through a suction line 74 of the compressor 32. In other embodiments, the vapor in the intermediate vessel may be drawn to an intermediate stage of the compressor 32 (e.g., not the suction stage). The liquid that collects in the intermediate vessel 70 may be at a lower enthalpy than the liquid refrigerant exiting the condenser 34 because of the expansion in the expansion device 66 and/or the intermediate vessel 70. The liquid from intermediate vessel 70 may then flow in line 72 through a second expansion device 36 to the evaporator 38.

It should be appreciated that any of the features described herein may be incorporated with an embodiment of the vapor compression system 14 or any other suitable HVAC&R systems. As discussed above, various electronic components may be located within the VSD 52. Indeed, other portions of the HVAC&R system 10 may also include electronic components, such as controllers of the HVAC&R system 10. In accordance with present embodiments, an improved cooling system is included to remove heat from electronic components of the HVAC&R system 10 and to reject the heat generated by the electronic components from the HVAC&R system 10.

Figure 5:
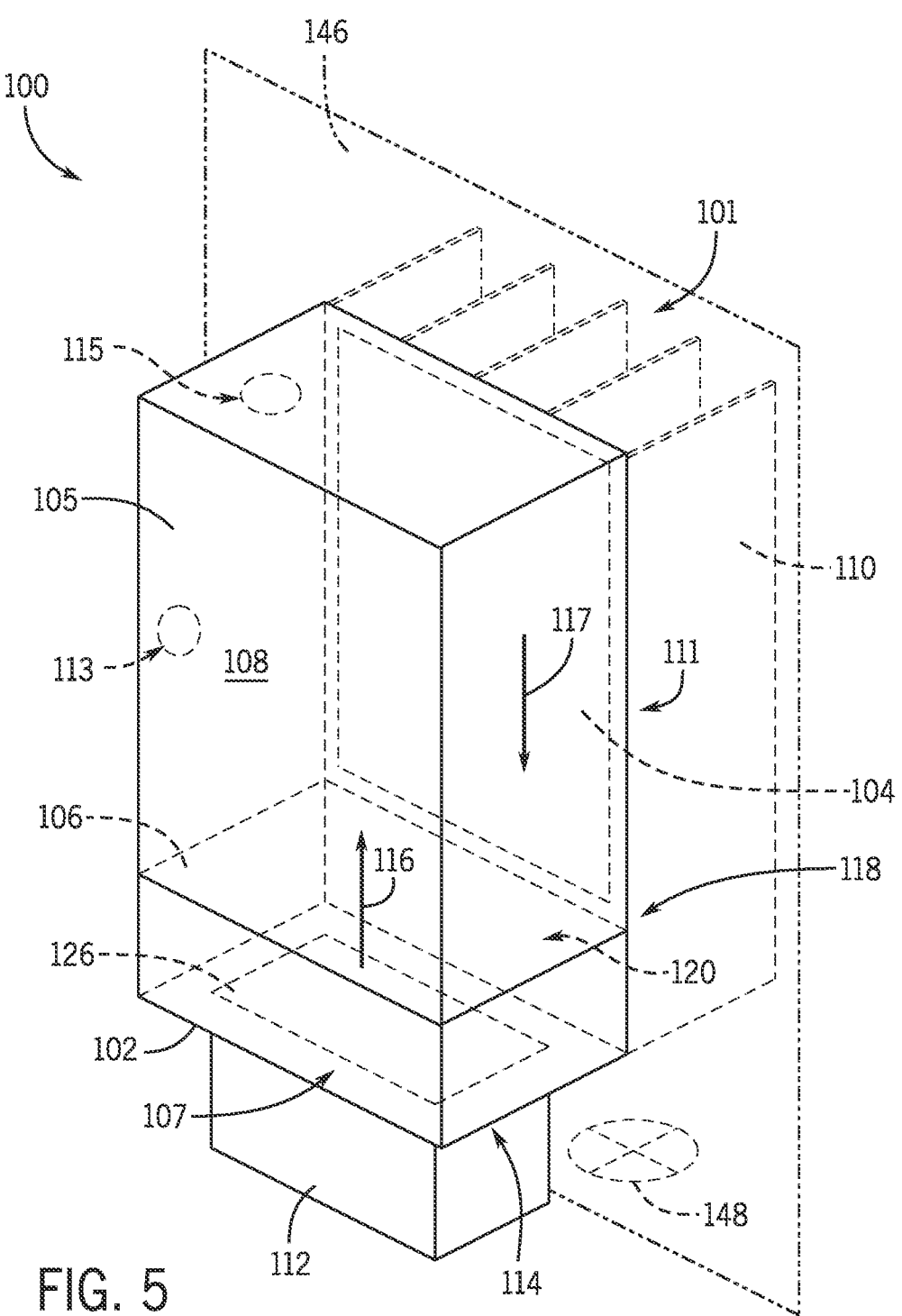
FIG. 5 is a schematic perspective view of an embodiment of a cooling system with an intermediate fluid chamber, in accordance with an aspect of the present disclosure.

For example, FIG. 5 is a schematic of an embodiment of a cooling system 100 having a heat rejection system 101 and a fluid chamber 108 (e.g., an intermediate fluid chamber, a container, a vessel, a tank, etc.) in thermal communication with the heat rejection system 101. In the illustrated embodiment, the heat rejection system 101 includes fins 110 (e.g., a heat sink) coupled (e.g., thermally coupled) to the fluid chamber 108. The cooling system 100 is configured to remove heat from an electronic component 112 of the HVAC&R system 10, such as an electronic component of the VSD 52 described above. The fluid chamber 108 is generally defined by a vessel, housing, or other enclosure 105 configured to contain a fluid 106 therein. As discussed below, in some embodiments, the fluid 106 may be a refrigerant. The enclosure 105 and/or the fluid chamber 108 includes an evaporating surface 102 and a condensing surface 104 formed on or by the enclosure 105 (e.g., within an interior of the fluid chamber 108). The fins 110 are disposed on an exterior surface 111 of the enclosure 105 that is opposite the condensing surface 104. While the condensing surface 104 and the fins 110 are illustrated on a particular side of the cooling system 100 (e.g., of the enclosure 105), it should be understood that the condensing surface 104 and the fins 110 may be positioned on any other suitable side of the cooling system 100. For example, in some embodiments, the condensing surface 104 and/or the fins 110 may be disposed on a side of the cooling system 100 (e.g., the enclosure 105) opposite the evaporating surface 102, such as a top or upper side of the cooling system 100.

In the illustrated embodiment, the enclosure 105 is formed as a rectangular box or container (e.g., a rectangular prism) that generally defines the fluid chamber 108 and may be formed from a metallic material such as copper, aluminum, steel, or another suitable metal. In other embodiments, the enclosure 105 may have any other suitable shape or profile. For example, the enclosure 105 and/or the fluid chamber 108 may be spherical, cubic, cylindrical, triangular, trapezoidal, hexagonal, or any other type of shape. In any case, a size, interior volume, and/or shape of the enclosure 105 may be chosen and/or selected based on a target pressure of fluid to be maintained within the fluid chamber 108, based on an expected heat density rejected by the electronic component 112, size constraints of the HVAC&R system 10, a type of the fluid 106 contained within the fluid chamber 108, an amount of the fluid 106 contained within the fluid chamber 108, or other operating parameter. Indeed, the size of the fluid chamber 108 and/or the enclosure 105 may be selected to enable the fluid 106 to circulate (e.g., between the condensing surface 104 and the evaporating surface 102) within a volume (e.g., a continuous volume, an open volume) of the fluid chamber 108 to cool the electronic component 112 without incorporating certain additional features, such as capillary structures (e.g., wicks), conduits, and the like, to direct the fluid 106 (e.g., liquid fluid) within the fluid chamber 108. As such, the amount of cooling provided by the fluid 106 may not be limited by friction or shear forces imparted onto the fluid 106 during circulation of the fluid 106 within the fluid chamber 108 (e.g., within the volume of the enclosure 105).

The enclosure 105 may be an enclosed (e.g., hermetically sealed) container to block flow of fluid 106 from within the fluid chamber 108 to an environment surrounding the enclosure 105. As will be appreciated, isolation of the fluid 106 within the fluid chamber 108 enables the cooling system 100 to operate without utilizing additional power (e.g., to power a pump for circulating the fluid 106 within the fluid chamber 108). In some embodiments, the enclosure 105 may include a charging port 113 to selectively enable flow of fluid 106 into the fluid chamber 108 (e.g., to fill the fluid chamber 108 with the fluid 106 and/or to otherwise adjust an amount of the fluid 106 within the fluid chamber 108). For example, the charging port 113 may be located on a side of the enclosure 105 that does not include the condensing surface 104 and/or the fins 110. A position of the charging port 113 may also be selected to enable the fluid chamber 108 to be at least partially filled with the fluid 106 (e.g., to block undesirable flow of the fluid 106 out of the fluid chamber 108 via the charging port 113), such that the fluid 106 (e.g., fluid 106 in a liquid state) covers, overlays, and/or fully contacts an entire or substantially entire surface area of the evaporating surface 102.

In some embodiments, the fluid chamber 108 may be initially filled with the fluid 106 via the charging port 113, and the charging port 113 may thereafter be brazed or otherwise mechanically sealed shut to block the fluid 106 from flowing out of the fluid chamber 108. In other embodiments, the charging port 113 may include a sealing element, such as a valve or plug, that enables future, selective access to the fluid chamber 108 (e.g., the interior volume of the enclosure 105). In this way, the charging port 113 may be utilized to, for example, periodically fill the fluid chamber 108 with additional fluid 106 and/or otherwise adjust an amount of the fluid 106 within the fluid chamber 108. Further, the enclosure 105 may include a sight glass (not shown) to observe and monitor an amount of the fluid 106 within the fluid chamber 108, for example, to determine whether additional fluid 106 should be added and/or whether the charging port 113 should be closed or sealed when fluid 106 is added to the fluid chamber 108.

In one or more embodiments, the enclosure 105 and/or fluid chamber 108 may include a pressure relief device 115 (e.g., pressure relief valve). The pressure relief device 115 may be a valve, disk, or any other type of pressure relief device configured to automatically enable discharge of the fluid 106 from the fluid chamber 108, such as when a pressure of the fluid 106 within the fluid chamber 108 reaches or exceeds a certain pressure threshold (e.g., threshold pressure value). For example, the pressure relief device 115 may include a burst disk disposed on a side or surface of the enclosure 105 (e.g., a top surface of the enclosure 105 and/or a side surface that does not include the condensing surface 104 and/or the fins 110). In such an embodiment, the burst disk may actuate (e.g., burst) when the pressure within the fluid chamber 108 exceeds a pre-determined threshold, thereby enabling discharge of the fluid 106 from the fluid chamber 108 and reducing the pressure within the fluid chamber 108. In other words, the pressure relief device 115 may be fluidly coupled or exposed to the fluid chamber 108 (e.g., the interior volume of the enclosure 105) and also fluidly coupled or exposed to an environment surrounding the enclosure 105. As a result, when the pressure relief device 115 is actuated, the fluid chamber 108 becomes fluidly coupled to the environment surrounding the enclosure 105, via the pressure relief device 115, thereby enabling flow of fluid 106 out of the fluid chamber 108 in order to reduce the pressure within the fluid chamber 108.

The fluid 106 in the fluid chamber 108 may be any suitable type of fluid, such as water, glycol, alcohol, R-1233zd, R-123, R-1234ze, R-1234yf, R-134a, R-410A, R-32, or another suitable type of refrigerant used in an HVAC&R system and/or for heat transfer. During operation of the cooling system 100, the fluid 106 may alternate between various states, such as a liquid state, a gaseous or vaporous state, a two-phase state, and so forth. The fluid 106 within the fluid chamber 108 may be selected based on operating parameters of the fluid 106, such as a boiling point temperature and/or pressure. Additionally or alternatively, the fluid 106 may be selected based on a target or expected amount of heat generated by the electronic component 112, as well as based on one or more parameters of the enclosure 105 and/or the fluid chamber 108, such as a size, shape, and/or material of the enclosure 105 and/or the fluid chamber 108. In some cases, a fluid that evaporates (e.g., boils) at a relatively low temperature and/or a relatively low pressure may be utilized in the fluid chamber 108. Indeed, a type and/or amount of the fluid 106 may be selected in order to achieve a substantially uniform pressure of the fluid 106 as the fluid 106 functions to transfer heat during operation of the cooling system 100. In any case, the fluid 106 may repeatedly transition between various phases (e.g., liquid and vapor) within the fluid chamber 108 during operation of the cooling system 100.

As set forth above, the enclosure 105 and/or the fluid chamber 108 includes the evaporating surface 102 on a side 114 (e.g., a bottom surface) of the enclosure 105. The evaporating surface 102 is partially or fully in contact with the fluid 106 inside the fluid chamber 108. In this way, thermal communication between the electronic component 112 and the fluid 106 is enabled via the evaporating surface 102. More specifically, the enclosure 105 and/or the fluid chamber 108 is arranged or configured such that fluid 106 in the liquid phase within the fluid chamber 108 (e.g., forming a liquid pool 107 within the fluid chamber 108) may partially or completely cover the evaporating surface 102 to which the electronic component 112 is thermally connected (e.g., via conduction). To this end, the evaporating surface 102 is formed or positioned in a bottom or lower portion (e.g., relative to gravity) of the fluid chamber 108. The electronic component 112 may be coupled (e.g., mounted) to the enclosure 105 on the side 114 and may be disposed external to the fluid chamber 108.

In some embodiments, the evaporating surface 102 includes copper or another conductive material. Indeed, in some embodiments, the evaporating surface 102 may include a different material than other portions of the enclosure 105. Further, the evaporating surface 102 may be enhanced with a texture, grooves, fins, cavities, pores, or other type of surface enhancements that facilitate heat transfer between the electronic component 112 and the fluid 106. For example, the evaporating surface 102 may be sealed against the electronic component 112 and may be porous (e.g., include one or more holes) to enable some direct contact between the electronic component 112 and liquid fluid 106. In this way, resistance of heat transfer between the electronic component 112 and the liquid fluid 106 is reduced because the liquid fluid 106 may directly exchange heat with the electronic component 112 instead of transferring all heat through the evaporating surface 102.

In operation, the evaporating surface 102 transfers heat from the electronic component 112 to the fluid 106, thereby causing the fluid 106 to increase in temperature, evaporate, and transition from a liquid state to a vapor state. The vapor fluid 106 may then flow in a direction 116 (e.g., an upward direction, relative to gravity) from the evaporating surface 102 and from the liquid pool 107 collected within the fluid chamber 108 adjacent to the evaporating surface 102. Indeed, the vapor fluid 106 may flow in the direction 116 (e.g., rise within the fluid chamber 108) because the vapor fluid 106 is less dense, and therefore buoyant, compared to the liquid fluid 106 in the liquid pool 107 at the bottom of the fluid chamber 108.

As mentioned above, the fluid chamber 108 is adjacent to the electronic component 112. That is, the enclosure 105 and the electronic component 112 are coupled to (e.g., mounted to, secured to) one another. The electronic component 112 may be any type of electronic device of the HVAC&R system 10 that produces or emits heat. For example, the electronic component 112 may be the VSD 52 or a component thereof (e.g., a microprocessor or control board). In other embodiments, the electronic component 112 may be a power panel, a control panel, a solid-state starter, and/or other device or system. In any case, the electronic component 112 is in contact with the evaporating surface 102 of the fluid chamber 108. For example, the evaporating surface 102 may be located on the side 114 (e.g., bottom side) of the enclosure 105 where liquid fluid 106 collects as a result of gravitational forces. In some embodiments, the enclosure 105 may include an opening 126 that is configured to receive or be in fluid communication (e.g., direct fluid communication) with the electronic component 112. For example, the electronic component 112 may be mounted to the enclosure 105 such that the electronic component 112 is aligned with the opening 126 (e.g., in an overlapping arrangement). In such embodiments, at least a portion of the electronic component 112 may form part or all of the evaporating surface 102 when the electronic component 112 is in direct contact with the fluid 106 (e.g., liquid fluid) within the fluid chamber 108.

Additionally, the enclosure 105 and/or the fluid chamber 108 includes the condensing surface 104 disposed on a side 118 (e.g., a lateral side) of the enclosure 105. However, the condensing surface 104 and/or an additional condensing surface may also be located on another surface of the enclosure 105, such as a top surface. In one or more embodiments, the condensing surface 104 is not on the same side 114 as the evaporating surface 102. The condensing surface 104 may be larger (e.g., have a larger surface area) than the evaporating surface 102 to enable increased heat transfer between the fluid 106 and the fins 110 of the cooling system 100. As the fluid 106 (e.g., vapor fluid) contacts the condensing surface 104 and transfers heat to the condensing surface 104 (and thus the fins 110), the vapor fluid 106 may condense into the liquid fluid 106. For example, the vapor fluid 106 may contact the condensing surface 104 and transition to a liquid phase, thereby increasing the density of the fluid 106, as heat is transferred from the fluid 106 to the condensing surface 104. In some embodiments, fluid 106 that has condensed may collect on the condensing surface 104 and may flow along the condensing surface 104. Indeed, the liquid fluid 106 may flow in a direction 117 opposite the direction 116 due to the increased density of the liquid fluid 106 and gravitational forces imparted to the liquid fluid 106. In some embodiments, the condensing surface 104 may include a texture, grooves, fins, cavities, pores, and/or any other type of surface features that may enhance heat transfer between the fluid 106 and the condensing surface 104. For example, the condensing surface 104 may include fins or grooves that are arranged to function as drainage channels that re-direct the fluid 106 condensed on the condensing surface 104 toward a base portion 120 (e.g., lower region, liquid fluid portion) of the fluid chamber 108 and/or the enclosure 105.

As described above, the heat rejection system 101 of the cooling system 100 may include the fins 110 disposed on the exterior surface 111 of the enclosure 105 that is opposite to the condensing surface 104 exposed to the fluid chamber 108. The fins 110 may have any suitable geometry, such as planar, rectangular, triangular, offset strips, pins, studs, annular, wavy, louvered, perforated, and/or any other type of protrusions and/or extensions that extend from the exterior surface 111. In some embodiments, the fins 110 are formed from the same material as the enclosure 105. In other embodiments, the fins 110 may include a different material than the enclosure 105 (e.g., a material having a higher thermal conductivity than the material of the enclosure 105). Because the fins 110 are positioned on the exterior surface 111 opposite the condensing surface 104, the fins 110 may absorb heat from the condensing surface 104 (e.g., heat transferred to the condensing surface 104 from the fluid 106). Forced or natural convection may be used to transfer heat absorbed from the fluid 106 and condensing surface 104 via the fins 110 to external air that is outside of the enclosure 105. For example, a fan 148 or other air moving device may force air through, across, and/or toward the fins 110 to enhance heat transfer from the fins 110 to the external air via forced convection. In some embodiments, the fan 148 may force air across the fins 110 in the direction 116 (e.g., upward) to enable subcooling of the liquid fluid 106 condensed on the condensing surface 104 and flowing toward the liquid pool 107 via gravity. In such an arrangement, the air absorbing heat from the fins 110 may increase in buoyancy as it flows through the fins 110, thereby facilitating more efficient flow of the air in the direction 116.

In another example, the cooling system 100 and/or the heat rejection system 101 may be positioned such that the fins 110 are disposed in an air flow path of the HVAC&R system 10 (e.g., an existing air flow path of the HVAC&R system 10 through which another air flow is directed). By way of example, the fan 148 may be configured to direct air across another device, such as another heat exchanger or electronic component, of the HVAC&R system 10 in addition to the fins 110 of the cooling system 100. Additionally or alternatively, the cooling system 100 may include a shroud or enclosure 146 that is disposed around some or all components of the cooling system 100. For example, the shroud or enclosure 146 may be disposed adjacent to the fins 110 and may be configured to direct an increased or focused flow of air through and/or between the fins 110 to increase a cooling capacity of the cooling system 100. In other embodiments, the fins 110 may be positioned in an environment having a relatively low temperature, such as an ambient environment surrounding the cooling system 100. In such embodiments, a portion of the shroud or enclosure 146 may generally extend between the enclosure 105 (e.g., the condensing surface 104) and the fins 110 and/or between the electronic component 112 and the fins 110, such that the fins 110 are disposed within the ambient environment, and the enclosure 105 and/or electronic component 112 are positioned within the shroud or enclosure 146 to protect the enclosure 105 and/or the electronic component 112 from the environment. In this way, the fins 110 may transfer heat to the environment via natural convection. In other embodiments, the enclosure 146 (e.g., a housing or section of the HVAC&R system 10) may surround the cooling system 100, including the fins 110, and may be configured to receive a flow of ambient air, direct the flow of ambient air across the fins 110, and discharge the flow of ambient air from the enclosure 146.

Turning to FIG. 6, a cross-sectional side elevation view of an embodiment of the cooling system 100 is shown. As shown in the illustrated embodiment, the cooling system 100 has a polygonal shape or profile and includes the enclosure 105 defining the fluid chamber 108 and having the condensing surface 104 and the evaporating surface 102. In the illustrated embodiment, the condensing surface 104 and the evaporating surface 102 are disposed opposite one another relative to the fluid chamber 108, and the electronic component 112 is not shown. The cooling system 100 also includes the heat rejection system 101 having the fins 110 attached to the enclosure 105. The cooling system 100 of FIG. 6 also includes a plurality of first baffles 130 and a second baffle 132 disposed within the fluid chamber 108 of the enclosure 105. The baffles 130, 132 may be coupled to or otherwise supported by the enclosure 105, and the baffles 130, 132 may direct or re-direct the flow of the fluid 106 within the fluid chamber 108 to facilitate cooling provided by the fluid 106. Although the baffles 130, 132 are substantially linear in the illustrated cooling system 100, any of the baffles 130, 132 may have a different shape in additional or alternative embodiments, such as having a curved and/or multi-segmented profile. These components are described in further detail below.

The plurality of first baffles 130 may be disposed within the fluid chamber 108 (e.g., within the enclosure 105) proximate to the condensing surface 104 (e.g., within an upper portion of the fluid chamber 108 opposite a lower portion containing the liquid pool 107). As set forth above, the cooling system 100 may evaporate the fluid 106 (e.g., transition liquid fluid to vapor fluid) via heat absorbed from the electronic component 112 via the evaporating surface 102. The plurality of first baffles 130 may be included in the fluid chamber 108 to direct a flow of vapor fluid 106 within the fluid chamber 108 toward the condensing surface 104. That is, the plurality of first baffles 130 may re-direct a flow direction of the vapor fluid 106 from the direction 116 to directions 133 toward the condensing surface 104. The plurality of first baffles 130 may reduce an amount of mixing between the vapor fluid 106 flowing from the evaporating surface 102 and liquid fluid 106 condensing at the condensing surface 104. The plurality of first baffles 130 may be of the same material as the enclosure 105 or any other suitable material.

In some embodiments, the plurality of first baffles 130 may include plates that are positioned at an angle 134 (e.g., downward angle, relative to horizontal, to the condensing surface 104, to another surface of the enclosure 105, etc.) to direct the vapor (e.g., from a surface 136 of the enclosure 105) toward the condensing surface 104. In some embodiments, the angle 134 of the plurality of first baffles 130 may slope downward toward the condensing surface 104 to facilitate a flow of any droplets of liquid fluid 106 mixed with or entrained in the vapor fluid 106 toward the evaporating surface 102 (e.g., via gravity) and/or to reduce entrainment of liquid fluid 106 within vapor fluid 106. In some embodiments, the plurality of first baffles 130 may be coupled to and/or otherwise extend into the fluid chamber 108 from one or more sides (e.g., lateral sides) of the enclosure 105. For example, the fluid chamber 108 may include the plurality of first baffles 130 extending from a first side 138 (e.g., lateral side) of the enclosure 105 to a second side (e.g., lateral side) of the enclosure 105, opposite the first side 138. In certain embodiments, the surface 136 of the enclosure 105 may be positioned at an angle 137 (e.g., relative to vertical) to deflect vapor fluid 106 toward the plurality of first baffles 130 and facilitate directing the vapor fluid 106 toward the condensing surface 104. As discussed above, the change in density of the fluid 106 between the liquid phase and the vapor phase may drive the flow of the fluid 106 within the fluid chamber 108 (e.g., in the direction 116, the directions 133, the direction 117, and a direction 149). Thus, the fluid 106 may flow within the fluid chamber 108 due to buoyancy, kinetic momentum, surface tension, surface adhesion, and/or gravitational forces without being driven by a pressure differential or capillary force within the fluid chamber 108.

The cooling system 100 may also include the second baffle 132 disposed within the fluid chamber 108 (e.g., within a lower portion opposite an upper portion having the plurality of first baffles 130). The second baffle 132 may be formed from the same material as the enclosure 105 or any other suitable material. In some embodiments, the second baffle 132 is a plate that extends along a common axis with the condensing surface 104 of the enclosure 105 and/or the evaporating surface 102 of the enclosure 105. For example, in the illustrated embodiment, the second baffle 132 is arranged in a substantially vertical orientation, similar to the condensing surface 104. Further, the second baffle 132 may extend along (e.g., parallel to) two opposing sides 140, 142 (e.g., lateral sides, vertical sides) of the enclosure 105. Additionally, the second baffle 132 may be substantially crosswise to a bottom surface 144 of the enclosure 105 and may be suspended above (e.g., relative to gravity) the bottom surface 144). In other embodiments, the second baffle 132 may be positioned at an angle with respect to the two opposing sides 140, 142, the condensing surface 104, the bottom surface 144, and/or the evaporating surface 102. Further, the second baffle 132 may be a plate that extends between the first side 138 of the enclosure 105 and the second side (not shown) of the enclosure 105 opposite the first side 138. In any case, the second baffle 132 may enable the liquid fluid 106 draining from condensing surface 104 to accumulate in the fluid chamber 108 near the bottom surface 144 (e.g., to form the liquid pool 107) and direct the fluid 106 toward the evaporating surface 102. More specifically, liquid fluid 106 collecting near the bottom surface 144 may accumulate between the second baffle 132 and the side 142 to create a column or "stack" of liquid fluid 106 condensed via the condensing surface 104. This fluid 106 may then be directed from the liquid pool 107 toward the evaporating surface 102 in the direction 149 (e.g., via a gap or opening 150 formed between the second baffle 132 and the bottom surface 144). As shown in FIG. 6, the second baffle 132 enables separation of the fluid chamber 108 into a first portion containing primarily liquid fluid 106 (e.g., fluid 106 condensed via the condensing surface 104) and a second portion containing primarily vapor fluid 106 (e.g., fluid 106 vaporized via the evaporating surface 102).

Embodiments of the cooling system 100 described herein may include additional features to enable more efficient cooling of the electronic component 112. For example, the cooling system 100 may include a temperature and/or pressure sensor(s) 152 coupled to the electronic component 112, disposed within the fluid chamber 108, coupled to the fins 110, or any combination thereof. Based on feedback from the one or more sensor(s) 152, operation of the HVAC&R system 10 and/or the cooling system 100 may be controlled. For example, the sensor(s) 152 may be configured to detect an operating parameter (e.g., a temperature, a pressure, etc.) of the fluid 106, a temperature of the evaporating surface 102, a temperature of the enclosure 105, or other operating parameter of another component of the cooling system 100. The HVAC&R system 10 may include a controller 154 (e.g., the control panel 40, an electronic controller, an automation controller), which may include a memory 156 and processing circuitry 158. The memory 156 may include volatile memory, such as random-access memory (RAM), and/or non-volatile memory, such as read-only memory (ROM), optical drives, hard disc drives, solid-state drives, or any other non-transitory computer-readable medium storing instructions that, when executed, control operation of the HVAC&R system 10 and/or the cooling system 100. The processing circuitry 158 (e.g., a microprocessor) may be configured to execute the instructions stored on the memory 156. As an example, the processing circuitry 158 may include one or more application specific integrated circuits (ASICs), one or more field programmable gate arrays (FPGAs), one or more general purpose processors, or any combination thereof. In some embodiments, the controller 154 may regulate operation of the fan 148 or other device to control a rate of heat exchange or cooling of the electronic component 112 based on feedback output by the sensor 152 (e.g., indicative of an operating parameter of the fluid 106, the enclosure 105, etc.). Indeed, in some embodiments, a controller of the HVAC&R system 10 and/or the cooling system 100 (e.g., the controller 154) may suspend operation of the HVAC&R system 10 or components thereof based on the sensor 152 feedback, such as based on a pressure within the fluid chamber 108 exceeding a threshold level or value. Sensor 152 feedback may also be utilized to determine a charge level of the fluid chamber 108 (e.g., an amount of the fluid 106 contained within the fluid chamber 108).

It should be noted that the heat rejection system 101 may include features in addition to or as an alternative to the fins 110. For example, the heat rejection system 101 may include a refrigerant circuit (e.g., a vapor compression system), a chilled fluid circuit (e.g., configured to circulate water, air, or glycol), a thermosiphon, a heat pipe, and/or any other suitable system configured to enable cooling of the fluid 106 within the enclosure 105. Additionally or alternatively, the enclosure 105 may include another arrangement of components (e.g., a thermosiphon, a heat pipe) configured to passively circulate the fluid 106 between the electronic component 102 and the heat rejection system 101 in order to transfer heat from the electronic component 102 to the heat rejection system 101, thereby cooling the electronic component 102. Various embodiments of alternative features incorporating the present techniques for cooling an electronic component are further discussed herein.

For instance, the techniques disclosed herein may also be utilized in embodiments having one or more air-cooled chillers. As an example, FIG. 7 is a schematic of an embodiment of the cooling system 100 that utilizes a refrigerant system 198 (e.g., the vapor compression system 14, a refrigerant circuit, a thermosiphon) circulating a refrigerant to cool an electronic component 228 (e.g., power electronics). In some embodiments, the refrigerant system 198 may also circulate the same refrigerant to cool a conditioning air flow and/or a conditioning fluid (e.g., water) supplied to cool a space serviced by the refrigerant system 198. That is, the refrigerant system 198 may be used to cool both the space and the electronic component 228 via the refrigerant. As such, certain additional components (e.g., a dedicated compressor, a dedicated pump, associated piping and wiring) may not be incorporated with the cooling system 100 to provide adequate cooling of the electronic component 228, thereby reducing a complexity and/or cost associated with cooling the electronic component 228, such as relative to other conventional systems (e.g., glycol cooling coils along with associated pumps, piping, and wiring). In further embodiments, the refrigerant system 198 may be a dedicated refrigeration system (e.g., fluidly separate from a refrigeration system used to cool the space) for cooling the electronic component 228.

The refrigerant system 198 may include a condenser coil 232 (e.g., a round-tube plate-fin condenser coil, a microchannel condenser coil, a shell-and-tube heat exchanger). For example, the condenser coil 232 may be positioned adjacent to the electronic component 228 (e.g., an electrical panel that includes the electronic component 228) to reduce a length or amount of conduits and/or a pressure drop of refrigerant during operation of the refrigerant system 198 to cool the electronic component 228, thereby improving efficient manufacture and/or operation of the refrigerant system 198 and/or the cooling system 100. In some embodiments, during operation of the refrigerant system 198, refrigerant vapor 200 is driven from a discharge of a compressor 199 or a pump of the refrigerant system 198 to the condenser coil 232 via a pressure differential within the refrigerant system 198 (e.g., a relatively higher pressure upstream of the condenser coil 232, a relatively lower pressure downstream of the condenser coil 232). The pressure differential within the refrigerant system 198 may drive flow of the refrigerant to cool the electronic component 228 without a substantial increase in an operating capacity (e.g., a pressurization) of the compressor 199 (e.g., compared to operation of the compressor 199 to cool another working fluid via the refrigerant system 198), thereby reducing power consumption associated with operation of the compressor 199. In other embodiments, the compressor 199 may be omitted, and the refrigerant system 198 may be a thermosiphon having the condenser coil 232. In such embodiments, the refrigerant may be directed from the condenser coil 232 toward the electronic component 228 via a thermosiphon effect or cycle. In further embodiments, the refrigerant system 198 may include other components configured to generate refrigerant pressure differentials within the refrigerant system 198, such as economizers, flash tanks, other heat exchangers, and so forth.

The refrigerant vapor 200 may enter a first header 202 of the condenser coil 232 and flow through a first pass 210 of the condenser coil 232 to at least partially condense into a liquid 214. That is, the liquid 214 may be a single phase or may be a liquid-rich two-phase refrigerant. For example, the condenser coil 232 may include a fan 215 configured to direct an air flow across the first pass 210 to cool the refrigerant vapor 200 flowing through the first pass 210 and condense the refrigerant vapor 200 into the liquid 214. The liquid 214 flows from the first pass 210 to a first evaporator 216 (e.g., a heat exchanger, a heat pipe), which is in thermal communication with (e.g., is attached to) the electronic component 228. The liquid 214 may absorb heat from the electronic component 228 via the first evaporator 216, thereby cooling the electronic component 228 and heating the liquid 214. For example, the liquid 214 may partially vaporize upon absorbing heat from the electronic component 228, thereby forming a first two-phase refrigerant 234 (e.g., a liquid-rich two-phase refrigerant 234).

The first two-phase refrigerant 234 flows from the first evaporator 216 to a second evaporator 218 (e.g., heat exchanger, heat pipe) that is in thermal communication with an air flow 226 directed across the second evaporator 218. The air flow 226 may also flow within an enclosure 230 (e.g., an electrical enclosure) that houses or contains the electronic component 228, such that the electronic component 228 may be separated or isolated from other components (e.g., the fan 215) of the refrigerant system 198. The enclosure 230 may shield or shroud the electronic component 228 from certain components of the refrigerant system 198 to reduce potential undesirable impact of the refrigerant flow in the refrigerant system 198 on operation of the electronic component 228. For example, the evaporators 216, 218 may be disposed within the enclosure 230, and the compressor 199 and/or the condenser coil 232 may be disposed external to the enclosure 230. The first two-phase refrigerant 234 may absorb heat from the air flow 226 via the second evaporator 218, thereby cooling the air flow 226 and heating the first two-phase refrigerant 234. The air flow 226 may be used to cool the electronic component 228 and/or other electronic components, such as other power electronics, within the enclosure 230. Heating of the first two-phase refrigerant 234 may further vaporize the refrigerant and form a second two-phase refrigerant 220 (e.g., a vapor-rich two-phase refrigerant 220).

From the second evaporator 218, the second two-phase refrigerant 220 flows through a second pass 212 of the condenser coil 232. In the second pass 212, the two-phase refrigerant 220 condenses to form a subcooled liquid 222. By way of example, the fan 215 and/or an additional fan may direct an air flow across the second pass 212 to cool the second two-phase refrigerant 220 flowing through the second pass 212. The subcooled liquid 222 may then exit the condenser coil 232 and flow toward other components of the refrigerant system 198. In some embodiments, the condenser coil 232 may be positioned relative to the electronic component 228 (e.g., at a common height, at a greater height) to enable desirable flow of refrigerant, such as during low load conditions. For example, the condenser coil 232 may be physically elevated relative to the first evaporator 216 and/or the electronic component 232, such that the liquid 214 flows from the first pass 210 to the first evaporator 216 and the electronic component 228 via gravity, and the second two-phase refrigerant 220, which may be more buoyant than the liquid 214, may flow more readily from the second evaporator 218 to the second pass 212 of the condenser coil 232.

In certain embodiments, the subcooled liquid 222 may be directed to cool other components (e.g., to a heat exchanger in thermal communication with a conditioning fluid and/or air flow for cooling a space), thereby heating and vaporizing the subcooled liquid 222. The vaporized refrigerant may then be directed back to the compressor 199 of the refrigerant system 198 for pressurization and discharge to the first pass 210 (e.g., as the refrigerant vapor 200). In additional or alternative embodiments, the compressor 199 may be omitted, and the vapor refrigerant may be circulated back to the condenser coil 232 as the refrigerant vapor 200. The refrigerant system 198 may include additional condenser coils, which may also be used to cool the other components, such as by using additional refrigerant flows circulated by the refrigerant system 198. By way of example, a portion of an entire amount or flow of refrigerant circulated by the refrigerant system 198 may be used to cool the electronic component 228, and a remainder of the entire amount of refrigerant circulated by the refrigerant system 198 may be used to cool the other components. Thus, the subcooled liquid 222 that exits the condenser coil 232 may be directed to combine with refrigerant flow exiting or passing through the additional condensers of the refrigerant system 198 prior to further circulation through the refrigerant system 198, such as for intake into the compressor 199 or into the first pass 210 of the condenser coil 232.

In the illustrated embodiment, the first header 202 of the condenser coil 232 includes a first baffle 206, and a second header 204 of the condenser coil 232 includes a second baffle 208, which are each configured to separate refrigerant flowing through the first and second passes 210 and 212 as the refrigerant flows through the first and second headers 202 and 204. While the illustrated cooling system 100 has a series flow arrangement for the refrigerant, other arrangements or configurations may be utilized, such as a parallel flow arrangement (e.g., the refrigerant flows from the first pass 210 through the evaporators 216, 218 in a parallel flow) or a flow arrangement that directs refrigerant along the illustrated series flow arrangement in an opposite direction than that shown. Additionally, the cooling system 100 may include other components, such as additional fans (e.g., positioned within the enclosure 230, positioned adjacent to the passes 210, 212) for ventilation purposes, additional passes for the condenser coil 232, and so forth, to facilitate operation of the refrigerant system 198 for cooling the electronic component 228.

In certain embodiments, the cooling system 100 may utilize separate refrigerant flows for cooling various electronic components, such as a dedicated refrigerant flow for each subset of electronic components. For example, the cooling system 100 (e.g., the refrigerant system 198) may include separate evaporators (e.g., heat exchangers, heat pipes) configured to cool respective electronic components, and each of the evaporators may be configured to receive a separate refrigerant flow, such as refrigerant flows (e.g., parallel refrigerant flows) from the same condenser coil 232 (e.g., the same or different passes of the same condenser coil 232) and/or refrigerant flows from different condenser coils. In embodiments in which each evaporator is configured to receive a refrigerant flow from a different condenser coil, a separate fan may be used to cool the refrigerant flows (e.g., the refrigerant vapor 200) within the respective condenser coils, and a control system of the cooling system 100 may be configured to operate (e.g., independently operate) each of the respective fans to cool the refrigerant flows and enable desired cooling provided by the refrigerant flows to the electronic components. Thus, the cooling system 100 may provide adequate cooling of electronic components using multiple refrigerant flows.

Further, the cooling system 100 may include multiple refrigerant systems 198 that are fluidly separate from one another (e.g., vapor compression systems, thermosiphons, etc. that are independently operable). Each refrigerant system 198 may operate to cool its associated electronic components 228. In some embodiments, a subset of the refrigerant systems 198 may include or be operated via common or shared electronic components 228. For this reason, the respective refrigerant from each refrigerant system 198 associated with the common electronic components 228 may be directed to cool the common electronic components 228. Thus, when any one or more refrigerant systems 198 are not in operation, refrigerant from the refrigerant system(s) 198 that are in operation may be used to provide cooling of the common electronic components 228. Accordingly, the operating electronic components 228 may be adequately cooled while any of the refrigerant systems 198 are in operation.

Further still, the refrigerant system 198 may include additional devices that may facilitate operation of the refrigerant system 198 to cool the electronic component 228. For instance, the refrigerant system 198 may include a dedicated pump (e.g., instead of or in addition to the compressor 199) configured to drive flow of the refrigerant (e.g., into the evaporators 216, 218), additional conduits configured to direct the refrigerant from a different component (e.g., an evaporator configured to cool a conditioning fluid or air flow via the refrigerant) of the refrigerant system 198 into any of the evaporators 216, 218, and the like to facilitate cooling provided by the refrigerant system 198 to the electronic component 228. Indeed, the refrigerant system 198 may include features to facilitate cooling of the electronic component 228 when the refrigerant circulated by the refrigerant system 198 is not in condition (e.g., the refrigerant is not at a sufficiently low temperature) to provide adequate cooling of the electronic component 228, such as during startup of the refrigerant system 198. In some embodiments, the refrigerant system 198 may include a thermosiphon or heat pipe configured to provide cooling of the electronic component 228, a device (e.g., a jet pump) configured to generate or inject vapor or other fluid into a refrigerant liquid flow to increase pressure and flow rate of the refrigerant liquid (e.g., toward the evaporators 216, 218), and so forth to enable the refrigerant system 198 to more readily cool the electronic component 228, such as during startup of the refrigerant system 198. The refrigerant system 198 may additionally or alternatively include features configured to direct refrigerant from another component (e.g., another heat exchanger) into any of the evaporators 216, 218, such as when refrigerant is not sufficiently flowing from the first pass 210 of the condenser 232 into the evaporators 216, 218 (e.g., during startup).

The refrigerant system 198 may further include drain valves and conduits configured to adjust the flow of the refrigerant through the refrigerant system 198. As an example, a drain valve and conduit may be configured to direct the refrigerant from the evaporators 216, 218 to bypass certain components (e.g., an evaporator configured to cool a conditioning fluid or air flow via the refrigerant) of the refrigerant system 198 that do not facilitate or enable cooling of the electronic component 228. Thus, the drain valve and conduit may enable supply of a dedicated refrigerant flow for cooling the electronic component 228. As another example, a drain valve and conduit may be configured to direct the refrigerant to bypass cooling of the electronic component 228 (e.g., to bypass flowing through the enclosure 230). For instance, the drain valve and conduit may be actuated to divert refrigerant flow away from the enclosure 230 to avoid overcooling the electronic component 228 (e.g., when the electronic component 228 is below a threshold temperature detected by a sensor, when an ambient temperature detected by a sensor is below a threshold temperature, during a predetermined time frame upon initiating operation of the electronic component 228), such as to avoid generation of condensation within the enclosure 230. Operation of any of the drain valves of the refrigerant system 198 may be controlled based on an operating parameter of the cooling system 100, such as an ambient temperature, a temperature of the electronic component 228, a time of operation of the cooling system 100, and so forth.

Although the illustrated refrigerant system 198 is configured to circulate a refrigerant configured to evaporate and condense during operation of the refrigerant system 198 to cool the electronic component 228, the refrigerant system 198 may use a different chilled fluid (e.g., water, glycol) to cool the electronic component 228. For example, the refrigerant system 198 may include a heat exchanger or conduit (e.g., a heat pipe or thermosiphon) in thermal communication with the electronic component 228, and the refrigerant system 198 may direct the chilled fluid (e.g., from a cooling tower, from a chilled fluid source, from a chiller, from a pump) to the heat exchanger. The chilled fluid may absorb heat from the electronic component 228 via the heat exchanger to cool the electronic component 228 (e.g., without changing phases of matter).

FIG. 8 is a perspective view of an embodiment of the cooling system 100, illustrating an embodiment of an evaporator 300 (e.g., a heat exchanger, a heat pipe) configured to enable cooling and/or heat rejection from an electronic component 302 via a refrigerant system (e.g., the refrigerant system 198). By way of example, the electronic component 302 may be an electronics module configured to function as a three-phase inverter for driving a compressor of a chiller. However, as discussed above, the electronic component 302 may be any electronic device or component that generates heat to be rejected by the cooling system 100. The evaporator 300 (e.g., the first evaporator 216) may include evaporator coils 304 (e.g., tubes, pipe), which may be configured to receive a refrigerant flow (e.g., the liquid 214), such as from a condenser (e.g., the condenser coil 232). In the illustrated embodiment, a support 306 (e.g., an intermediate support, block, base, mounting segment) is coupled to the evaporator coils 304. For example, the support 306 may include multiple portions and segments 308 configured to capture (e.g., individually capture) the evaporator coils 304. The support 306 may be configured to couple to the electronic component 302 and place the electronic component 302 in thermal communication with the refrigerant flowing through the evaporator 300. The support 306 may include first holes 310 formed therein, which are configured to align with second holes 312 of the electronic component 302. For example, the second holes 312 may be formed in a base structure (e.g., a substrate) configured to support the electronic component 302. Respective fasteners may then be inserted into the aligned holes 310, 312 to secure the electronic component 302 and the support 306 to one another and establish thermal communication between the evaporator coils 304, the support 306, and the electronic component 302.

In some embodiments, the evaporator 300 (e.g., a heat pipe, a thermosiphon) may be configured to passively circulate the refrigerant or other working fluid within the evaporator 300 without operation of a compressor or pump. For example, the refrigerant may flow within the evaporator 300 due to buoyancy, capillary forces, kinetic momentum, and/or gravitational forces, such as to flow into the evaporator coils 304 via an inlet conduit 314 and to flow out of the evaporator coils 304 via an outlet conduit 316. Indeed, the evaporator 300 may include or be in thermal communication with a heat rejection system (e.g., the heat rejection system 101) configured to cool the refrigerant, such as at a portion or end of the evaporator 300 opposite the evaporator coils 304. The heat rejection system may include an actively operated heat rejection system (e.g., a vapor compression system, a chilled fluid circuit, a fan) and/or a passive heat rejection system (e.g., fins, a thermosiphon). Heating of the refrigerant via the electronic component 302 at the evaporator coils 304 may cause the refrigerant to move (e.g., via natural forces) away from the evaporator coils 304 toward the heat rejection system, where the refrigerant may be cooled. Cooling of the refrigerant via the heat rejection system may then cause the cooled refrigerant to move (e.g., via natural forces) toward the evaporator coils 304 to cool the electronic component 302. Thus, the refrigerant may continually circulate between the heat rejection system and the evaporator coils 304 without an active operation of another component (e.g., a pump or compressor) to direct the refrigerant. However, the refrigerant may additionally or alternatively be actively circulated through the evaporator 300, such as via a compressor and/or pump. As an example, the evaporator 300 may be a part of a refrigerant circuit or a chilled fluid circuit, and the refrigerant may be actively directed (e.g., via a compressor, via a pump) to the evaporator coils 304 and to other components configured to place the refrigerant in thermal communication with another cooling fluid (e.g., refrigerant, water, glycol) and then to return to the evaporator coils 304.

FIG. 9 is a perspective view of an embodiment of the cooling system 100, illustrating the electronic component 302 coupled to the evaporator 300 (e.g., a heat exchanger, a heat pipe) via the support 306 to place the electronic component 302 in thermal communication with the refrigerant flowing through the evaporator 300. As an example, the electronic component 302 (e.g., a substrate or base structure of the electronic component 302) may abut the evaporator coils 304 when the electronic component 302 is secured to the support 306. During operation of the evaporator 300 in the illustrated configuration, heat may transfer from the electronic component 302 to the evaporator coils 304 and/or the support 306 and to the refrigerant flowing through the evaporator coils 304, thereby cooling the electronic component 302. The support 306 may be made of a conductive material to increase heat absorption from the electronic component 302. In this way, the support 306 may provide additional thermal mass to absorb heat from and therefore cool the electronic component 302. For example, when the evaporator 300 is not substantially cooling the electronic component 302 via the refrigerant (e.g., when the evaporator 300 is not in operation, when the temperature of the refrigerant flowing through the evaporator coils 304 is elevated, when refrigerant flow through the evaporator coils 304 is suspended), such as during startup of the cooling system 100 prior to refrigerant flow through the evaporator 300 being established, the support 306 may operate as a heat sink to provide an amount cooling of the electronic component 302 by absorbing heat from the electronic component 302 and discharging the heat into an ambient environment (e.g., via convection).

The refrigerant system 198 may also be configured to cool the fluid 106 within the fluid chamber 108 in addition to or as an alternative to cooling of the fluid 106 provided via the fins 110. For example, the first evaporator 216 of the refrigerant system 198 may be in thermal communication with the condensing surface 104 of the enclosure 105. In this manner, the refrigerant circulated by the refrigerant system 198 may be configured to cool the fluid 106 in the fluid chamber 108, and the fluid 106 in the fluid chamber 108 may therefore be conditioned to cool the electronic component 228.

With this in mind, FIG. 10 is a schematic of an embodiment of the cooling system 100, illustrating the refrigerant system 198 configured to cool the fluid 106 in the fluid chamber 108. In this manner, the refrigerant system 198 may be incorporated as a system of the heat rejection system 101 described above. In the illustrated cooling system 100, the first evaporator 216 is in thermal communication with (e.g., coupled to, abutting against, mounted to) the condensing surface 104 of the enclosure 105 similarly described above. Thus, the refrigerant (e.g., the liquid 214) directed through the first evaporator 216 may absorb heat from the fluid 106 within the fluid chamber 108 to cool the fluid 106. Indeed, the illustrated refrigerant system 198 may operate using any of the techniques described above. Further, the evaporating surface 102 of the enclosure 105 may be in thermal communication with the electronic component 228. In this way, the fluid 106 within the fluid chamber 108 (e.g., the fluid 106 cooled by the refrigerant directed through the first evaporator 216) may be configured to cool the electronic component 228 via the evaporating surface 102.

Although the condensing surface 104 is positioned at a side of the enclosure 105 opposite the side of the evaporating surface 102, the condensing surface 104 and/or the evaporating surface 102 may be positioned at any suitable side(s) of the enclosure 105 containing the fluid 106 within the fluid chamber 108. For example, the condensing surface 104 may be disposed at or on a top side of the enclosure 105, the evaporating surface 102 may be disposed at or on a bottom side of the enclosure 105, and so forth. Moreover, the first evaporator 216 may be oriented in any suitable manner relative to the fluid chamber 108 and/or the enclosure 105 to direct the refrigerant (e.g., the liquid 214) through the first evaporator 216 in a particular flow direction with respect to that of the fluid 106 within the fluid chamber 108 (e.g., along the condensing surface 104 to cause the fluid 106 to transition from vapor to liquid). For instance, the flow direction of the refrigerant in the first evaporator 216 may in substantially the same direction as (e.g., parallel to) the flow direction of the fluid 106 along the condensing surface 104 in the fluid chamber 108, the flow direction of the refrigerant in the first evaporator 216 may be opposite the flow direction of the fluid 106 along the condensing surface 104 in the fluid chamber 108 (e.g., in a counterflow arrangement), the flow direction of the refrigerant in the first evaporator 216 may be crosswise to the flow direction of the fluid 106 along the condensing surface 104 in the fluid chamber 108, and so forth.

The refrigerant system 198 may also be configured to cool another component configured to cool the electronic device 228. As an example, FIG. 11 is a schematic of an embodiment of the cooling system 100 including a heat pipe 330 (e.g., the evaporator 300) configured to cool the electronic component 228. For example, the heat pipe 330 may include a condensing surface 332 that may couple to, secure to, and/or abut against the evaporator 216. For example, the heat pipe 330 may be embedded in (e.g., in physical contact with) a portion of the evaporator 216 to maintain contact and thermal communication with the evaporator 216. Thus, the refrigerant (e.g., the liquid 214) flowing through the evaporator 216 may be configured to absorb heat from a fluid (e.g., a refrigerant) circulated within the heat pipe 330 via the condensing surface 332, thereby cooling and condensing the fluid into a liquid within the heat pipe 330. In some embodiments, the heat pipe 330 may include a capillary structure (e.g., wicks) that may absorb the condensed fluid. The capillary structure may drive the cool, liquid fluid via capillary forces to flow through the capillary structure in a first direction 334 toward an evaporating surface 336 of the heat pipe 330. The evaporating surface 336 may be in thermal communication with the electronic component 228. Thus, the cool, liquid fluid may absorb heat from the electronic component 228 via the evaporating surface 336, thereby cooling the electronic component 228. As a result, the fluid may be heated and may flow in a second direction

338 from the evaporating surface 336 to the condensing surface 332 (e.g., via an open volume defined by the heat pipe 330), where the fluid may be re-cooled in the manner described above. Thus, the fluid in the heat pipe 330 may continually circulate between the condensing surface 332 and the evaporating surface 336 during operation of the refrigerant system 198 to cool the electronic component 228. Indeed, the fluid may passively circulate within the heat pipe 330 (e.g., without operation of a compressor or pump that drives movement of the fluid), thereby reducing costs associated with operating the illustrated cooling system 100.

In the illustrated cooling system 100, the first direction 334 of fluid flow in the heat pipe 330 from the condensing surface 332 to the evaporating surface 336 may be opposite the direction of the flow of refrigerant through the first evaporator 216 (e.g., a counterflow arrangement). However, in additional or alternative embodiments, the flow of fluid through the heat pipe 330 from the condensing surface 332 to the evaporating surface 336 may be in any suitable direction relative to the flow of refrigerant through the first evaporator 216, such as in substantially the same direction (e.g., a parallel flow arrangement) or in a crosswise direction. Furthermore, the heat pipe 330 may be oriented in any suitable manner such that the condensing surface 332 is in thermal communication with the first evaporator 216. For instance, the condensing surface 332 may be disposed on a lateral side, a top side, and/or a bottom or underside of the first evaporator 216. Indeed, the heat pipe 330 may be coupled to the first evaporator 216 in any suitable manner to utilize buoyancy, gravitational forces, capillary forces, and/or kinetic momentum to circulate fluid within the heat pipe 330, and the fluid may flow in any suitable direction through the heat pipe 330 with respect to gravity, such as in a vertical and/or a horizontal direction, to facilitate heat exchange with the refrigerant. To this end, the condensing surface 332 may also extend in any suitable direction relative to a length of the first evaporator 216, such as along (e.g., axial to) the length or crosswise (e.g., transverse) to the length. Further still, although the condensing surface 332 of the illustrated heat pipe 330 extends linearly, the condensing surface 332 may extend in any suitable manner in additional or alternative embodiments. By way of example, the condensing surface 332 may curve or change directions (e.g., a zigzag) along the first evaporator 216, and/or the condensing surface 332 may form multiple loops or coils configured to capture the first evaporator 216 (e.g., a cylindrical profile of the first evaporator 216).

In further embodiments, the condensing surface 332 may be inserted into and extend through an interior of the first evaporator 216. As such, a portion of the heat pipe 330 may be submerged within the liquid 214 contained in the first evaporator 216, such as a pool of the liquid 214 to cool the heat pipe 330 via free convection or pool boiling. In such embodiments, baffles may be disposed within the evaporator 216 and/or surfaces (e.g., internal surfaces) of the evaporator 216 may include enhanced surfaces (e.g., finned surfaces) to direct the refrigerant across the condensing surface 332 within the first evaporator 216. Moreover, the cooling system 100 may include any suitable number of heat pipes 330 for cooling the electronic component 228. For example, the heat pipes 330 may be positioned in a parallel arrangement (e.g., the fluid in each of the heat pipes 330 are in thermal communication with the electronic component 228 and the refrigerant flowing through the first evaporator 216 in a side-by-side or end-to-end arrangement) or in a series arrangement (the fluid in a subset of the heat pipes 330 are in thermal communication with one another). The heat pipes 330 may also utilize a different amount and/or type of fluid to cool one another and/or the electronic component 228.

While only certain features and embodiments have been illustrated and described, many modifications and changes may occur to those skilled in the art, such as variations in sizes, dimensions, structures, shapes and proportions of the various elements, values of parameters, such as temperatures and pressures, mounting arrangements, use of materials, colors, orientations, and so forth, without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the disclosure. Furthermore, in an effort to provide a concise description of the exemplary embodiments, all features of an actual implementation may not have been described, such as those unrelated to the presently contemplated best mode, or those unrelated to enablement. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A cooling system of a heating, ventilation, air conditioning, and refrigeration (HVAC&R) system, comprising:
an enclosure defining a fluid chamber and comprising:
an evaporating surface configured to be in thermal communication with a liquid fluid in the fluid chamber and with an electronic component of the HVAC&R system coupled to the enclosure, wherein the evaporating surface is configured to transfer thermal energy from the electronic component to the liquid fluid, such that the liquid fluid transitions to a vapor fluid within the fluid chamber; and
a condensing surface configured to absorb thermal energy from the vapor fluid, such that the vapor fluid condenses into the liquid fluid within the fluid chamber;
a heat rejection system coupled to an exterior surface of the enclosure, wherein the heat rejection system is configured to absorb thermal energy from the condensing surface; and
a plurality of baffles positioned within the enclosure, wherein the plurality of baffles is configured to direct the vapor fluid toward the condensing surface, and each baffle of the plurality of baffles is sloped at a downward angle toward the condensing surface.

2. The cooling system of claim 1, wherein the heat rejection system comprises a plurality of fins.

3. The cooling system of claim 2, comprising a fan configured to force air across the plurality of fins.

4. The cooling system of claim 2, comprising an additional enclosure configured to guide air across the plurality of fins, wherein at least a portion of the cooling system is disposed within the additional enclosure.

5. The cooling system of claim 1, comprising an additional baffle positioned within the fluid chamber and configured to create a column of the liquid fluid within the fluid chamber and to direct the liquid fluid toward the evaporating surface.

6. The cooling system of claim 5, wherein the additional baffle is disposed above a bottom surface of the enclosure, relative to gravity, to form a gap between the additional baffle and the bottom surface.

7. A cooling system of a heating, ventilation, air conditioning, and refrigeration (HVAC&R) system, comprising:
a heat rejection system; and
an enclosure defining a fluid chamber configured to contain a fluid therein, wherein the enclosure comprises:
a first surface configured to be in thermal communication with an electronic component of the HVAC&R system coupled to the enclosure, wherein the first surface is configured to transfer thermal energy from the electronic component to the fluid to vaporize the fluid within the enclosure;
a second surface in thermal communication with the heat rejection system, wherein the second surface is configured to transfer thermal energy from the fluid to the heat rejection system to condense the fluid within the enclosure; and
a third surface opposite the second surface relative to the fluid chamber, wherein the third surface is angled toward the second surface to direct fluid vaporized in the fluid chamber from the first surface toward the second surface.

8. The cooling system of claim 7, wherein the heat rejection system comprises a plurality of fins coupled to an exterior surface of the enclosure on a lateral side of the enclosure.

9. The cooling system of claim 8, comprising a fan configured to direct an air flow across the plurality of fins, wherein the cooling system is configured to direct fluid vaporized in the fluid chamber in a first direction, the cooling system is configured to direct fluid condensed in the fluid chamber in a second direction, opposite the first direction, and the fan is configured to direct the air flow across the plurality of fins in the first direction.

10. The cooling system of claim 9, comprising:
a sensor configured to detect an operating parameter of the fluid within the fluid chamber and to output feedback indicative of the operating parameter; and
a controller communicatively coupled to the sensor and to the fan, wherein the controller is configured to regulate operation of the fan in response to the feedback.

11. The cooling system of claim 7, wherein the first surface is a bottom surface of the enclosure, and the second surface extends crosswise to the first surface.

12. The cooling system of claim 7, comprising the electronic component coupled to the enclosure, wherein the first surface comprises an opening, and the electronic component is aligned with the opening such that at least a portion of the electronic component forms at least a portion of the first surface to enable direct contact between the electronic component and the fluid.

13. A heating, ventilation, air conditioning, and refrigeration (HVAC&R) system, comprising:

an electronic component of the HVAC&R system configured to generate heat during operation of the HVAC&R system; and a cooling system coupled to the electronic component, wherein the cooling system comprises:

an enclosure defining a fluid chamber configured to contain liquid fluid;

an evaporating surface of the enclosure in thermal communication with the electronic component, wherein the evaporating surface is configured to transfer thermal energy from the electronic component to the liquid fluid in the fluid chamber to vaporize the liquid fluid into a vapor fluid;

a condensing surface of the enclosure configured to be in thermal communication with a heat rejection system of the cooling system, wherein the condensing surface is configured to transfer thermal energy from the vapor fluid to the heat rejection system to condense the vapor fluid into the liquid fluid; and a baffle disposed within the enclosure and configured to direct the vapor fluid from the evaporating surface toward the condensing surface, wherein the baffle is sloped at a downward angle toward the condensing surface.

14. The HVAC&R system of claim 13, wherein the evaporating surface is disposed on a first side of the enclosure, and the condensing surface is disposed on a second side, opposite the first side, of the enclosure.

15. The HVAC&R system of claim 14, comprising an additional baffle positioned within the enclosure and between the evaporating surface and the condensing surface, wherein the additional baffle is configured to create a column of the liquid fluid between the additional baffle and the condensing surface and to direct the liquid fluid from the condensing surface toward the evaporating surface.

16. The HVAC&R system of claim 13, wherein the enclosure comprises a pressure relief device configured to actuate in response to a pressure within the enclosure exceeding a predetermined threshold.

17. The HVAC&R system of claim 13, comprising the heat rejection system, wherein the heat rejection system comprises a plurality of fins coupled to the enclosure, and wherein the plurality of fins is configured to transfer thermal energy from the condensing surface to an air flow directed across the plurality of fins.

* * * * *